US012399205B2

(12) United States Patent
Bussey et al.

(10) Patent No.: US 12,399,205 B2
(45) Date of Patent: Aug. 26, 2025

(54) CONTROLLER FOR AN ELECTROMAGNETIC FIELD DETECTOR

(71) Applicant: BRITISH TELECOMMUNICATIONS PUBLIC LIMITED COMPANY, London (GB)

(72) Inventors: Liam Bussey, London (GB); Fraser Burton, London (GB); Amelia Winterburn, London (GB); Marco Menchetti, London (GB)

(73) Assignee: British Telecommunications Public Limited Company, London (GB)

( * ) Notice: Subject to any disclaimer, the term of this patent is extended or adjusted under 35 U.S.C. 154(b) by 172 days.

(21) Appl. No.: 18/548,391

(22) PCT Filed: Feb. 16, 2022

(86) PCT No.: PCT/EP2022/053845
§ 371 (c)(1),
(2) Date: Aug. 30, 2023

(87) PCT Pub. No.: WO2022/184443
PCT Pub. Date: Sep. 9, 2022

(65) Prior Publication Data
US 2024/0295594 A1 Sep. 5, 2024

(30) Foreign Application Priority Data
Mar. 1, 2021 (GB) ..................... 2102870

(51) Int. Cl.
G01R 29/08 (2006.01)
(52) U.S. Cl.
CPC ..... *G01R 29/0885* (2013.01); *G01R 29/0892* (2013.01)

(58) Field of Classification Search
CPC .............. G01R 29/0885; G01R 29/0892
(Continued)

(56) References Cited

U.S. PATENT DOCUMENTS 6,826,339 B1   11/2004   Mueller
9,869,731 B1*  1/2018   Hovde ................. G01R 33/26
(Continued)

FOREIGN PATENT DOCUMENTS

CN   1882859 A     12/2006
CN   205691490 U   11/2016
(Continued)

OTHER PUBLICATIONS

"Combined Search and Examination Report under sections 17 & 18(3) for Great Britain Application No. 2010995.5, mailed on Apr. 9, 2021".
(Continued)

*Primary Examiner* — Christopher P McAndrew
(74) *Attorney, Agent, or Firm* — EIP US LLP

(57) ABSTRACT

This disclosure provides a method of controlling an electromagnetic field detector by causing a first phase shift to be applied to a second probe signal path so as to cause a variation in a change in intensity of combined first and second paths of a probe signal; obtaining data indicating a second phase shift to be applied to the second probe signal path so as to increase the change in intensity of the combined first and second paths of the probe signal, wherein the second phase shift is determinable from a variation in the change in intensity of the combined first and second paths of the probe signal caused by the first phase shift; and causing the second phase shift to be applied to the second probe signal path.

14 Claims, 14 Drawing Sheets

(58) Field of Classification Search
USPC .......................................................... 324/629
See application file for complete search history.

(56) References Cited

U.S. PATENT DOCUMENTS

| | | | |
|---|---|---|---|
| 10,371,763 B2* | 8/2019 | Salit | G01R 33/26 |
| 10,763,966 B1 | 9/2020 | Deb et al. | |
| 10,823,775 B2* | 11/2020 | Anderson | G01R 29/0878 |
| 10,979,147 B2 | 4/2021 | Gordon et al. | |
| 11,598,798 B1* | 3/2023 | Bucklew | G01R 29/0885 |
| 2008/0278710 A1 | 11/2008 | Schmidt et al. | |
| 2009/0289629 A1 | 11/2009 | Tuchman | |
| 2011/0057737 A1* | 3/2011 | Aoyama | H03L 7/26 |
| | | | 331/94.1 |
| 2016/0363617 A1 | 12/2016 | Anderson et al. | |
| 2019/0187198 A1 | 6/2019 | Anderson et al. | |
| 2020/0136727 A1 | 4/2020 | Graceffo et al. | |
| 2021/0048465 A1 | 2/2021 | Anderson et al. | |

FOREIGN PATENT DOCUMENTS

| | | |
|---|---|---|
| CN | 104714110 B | 9/2017 |
| CN | 107179450 A | 9/2017 |
| CN | 107462849 A | 12/2017 |
| CN | 108152602 A | 6/2018 |
| CN | 106124856 B | 10/2018 |
| CN | 108809341 A | 11/2018 |
| CN | 108927314 A | 12/2018 |
| CN | 109342830 A | 2/2019 |
| CN | 109905177 A | 6/2019 |
| CN | 107462849 B | 1/2020 |
| CN | 109342830 B | 7/2021 |
| CN | 113514698 A | 10/2021 |
| EP | 3308146 A1 | 4/2018 |
| GB | 2588754 A | 5/2021 |
| GB | 2597260 A | 1/2022 |
| WO | 2016205330 A1 | 12/2016 |
| WO | 2018103897 A1 | 6/2018 |
| WO | 2021243260 A1 | 12/2021 |

OTHER PUBLICATIONS

"Extended European Search Report for Application No. 19205106.8, mailed on Apr. 29, 2020".

"International Preliminary Report on Patentability for PCT Patent Application No. PCT/EP2020/075070, mailed on May 5, 2022".

"International Preliminary Report on Patentability for PCT Patent Application No. PCT/EP2021/065655, mailed on Jul. 29, 2022".

"International Search Report and Written Opinion for Application No. PCT/EP2020/075070, mailed on Dec. 15, 2020".

"International Search Report and Written Opinion for Application No. PCT/EP2021/065655, mailed on Aug. 23, 2021".

"International Search Report and Written Opinion for PCT Patent Application No. PCT/EP2022/053845, mailed on May 16, 2022".

"International Search Report and Written Opinion received for PCT Patent Application No. PCT/EP2022/053707, mailed on May 16, 2022".

"Office Action received for Chinese Patent Application No. 202080066526.3, mailed on Jul. 7, 2022".

"Office Action received for European Patent Application No. 20765052.4, mailed on Aug. 16, 2022".

"Office Action received for Great Britain Patent Application No. 1915420.2, mailed on Apr. 22, 2020".

"Office Action received for Great Britain Patent Application No. 2102870.9, mailed on Nov. 24, 2021".

"Search Report received for Great Britain Patent Application No. 2201989.7, mailed on Mar. 7, 2022".

"Search Report under Section 17 for Great Britain Patent Application No. 2202067.1, mailed on Jul. 13, 2022".

Anderson, D. A., et al., "An Atomic Receiver for AM and FM Radio Communication", , Aug. 26, 2018, 6 pages.

Egan, Patrick, et al., "Absolute refractometry of dry gas to ±3 parts in $10^{\wedge}9$", , Jun. 20, 2011, pp. 3076-3086.

Epple, G., et al., "Rydberg Atoms in Hollow-Core Photonic Crystal Fibres", Nature Communications, 5 pages.

Fan, Haoquan, et al., "Atom Based RF Electric Field Sensing", Journal of Physics B: Atomic, Molecular and Optical Physics. 48 202001, 17 pages.

Holloway, et al., "Detecting and Receiving Phase-Modulated Signals With a Rydberg Atom-Based Receiver", IEEE Antennas and Wireless Propagation Letters, vol. 18, No. 9, Sep. 9, 2019, 5 pages.

Holloway, C. L., et al., "A Multiple-Band Rydberg-Atom Based Receiver/Antenna: AM/FM Stereo Reception", National Institute of Standards and Technology (NIST), Boulder, CO 80305, Mar. 2, 2019, 10 pages.

Holloway, C. L., et al., "Detecting and Receiving Phase Modulated Signals with a Rydberg Atom-Based Mixer", National Institute of Standards and Technology, Boulder, CO 80305, USA, Mar. 27, 2019, 5 pages.

Holloway, C. L., et al., "Development and Applications of a Fiber-Coupled Atom-Based Electric Field Probe", 2018 International Symposium on Electromagnetic Compatibility (EMC Europe), IEEE, Aug. 27-30, 2018, pp. 381-385.

Kaatuzian, H, et al., "Electromagnetically Induced Transparency Using Six Level Atoms Doped in the Crystalline Medium", , Nov. 21, 2005, 4 pages.

Kumar, S., et al., "Atom-Based Sensing of Weak Radio Frequency Electric Fields Using Homodyne Readout", Scientific Reports, vol. 7 (42981), retrieved from the internet URL:https://www.nature.com/articles/srep42981.pdf, 10 pages.

Ma, L., et al., "Paschen-Back Effect and Rydberg-State Diamagnetism in Vapor-Cell Electromagnetically Induced Transparency", arxiv.org, Atomic Physics, 6 pages.

Meyer, David H., et al., "Assessment of Rydberg Atoms for Wideband Electric Field Sensing", arxiv.org, Jan. 13, 2020, 16 pages.

Simons, M. T., et al., "A Rydberg Atom-Based Mixer: Measuring the Phase of a Radio Frequency Wave", , Mar. 9, 2019, 4 pages.

Simons, M. T., et al., "Fiber-Coupled Vapor Cell for a Portable Rydberg Atom-Based Radio Frequency Electric Field Sensor", Applied Optics, vol. 57 (22), Jul. 26, 2018, 5 pages.

Simons, Matthew T., et al., "Embedding a Rydberg Atom-Based Sensor into an Antenna for Phase and Amplitude Detection of Radio-Frequency Fields and Modulated Signals", , 2019, 10 pages.

Song, Z., et al., "Rydberg-Atom-Based Digital Communication using a Continuously Tunable Radio-Frequency Carrier", Optics Express, vol. 27, No. 6, pp. 8848-8857.

* cited by examiner

CONTROLLER FOR AN ELECTROMAGNETIC FIELD DETECTOR

PRIORITY CLAIM

The present application is a National Phase entry of PCT Application No. PCT/EP2022/053845, filed Feb. 16, 2022, which claims priority from GB Patent Application No. 2102870.9, filed Mar. 1, 2021, each of which is hereby fully incorporated herein by reference.

TECHNICAL FIELD

The present disclosure relates to a method of controlling an electromagnetic field detector and a device for implementing the method.

BACKGROUND

Conventional RF detectors, such as a dipole antenna, utilize metallic conductors in which electrons move along the conductor in response to an incident RF electric field to produce a small current. In addition to merely detecting the RF signal, an RF detector may be created by converting this current (e.g. utilizing electronic circuits, mixers, amplifiers and digitizers) into a demodulated, amplified signal.

In many applications it is desirable to reduce the size of the RF receiver. However, conventional RF receivers based on metallic conductors are limited in size as the relationship between sensitivity, frequency and conductor length means that the RF receiver will not perform adequately below a certain size for a given application. An electrically small antenna is one that is operated at a frequency below its natural resonance, but these are limited by the Chu limit that will set the minimum size for any antenna used at a given frequency. A further limitation for conventional RF receivers is that the ability to sense weak RF signals is dependent on the receiver's gain, which is determined by the design of the antenna. Accordingly, the performance of a conventional antenna is restricted in size, bandwidth and sensitivity.

A new form of RF receiver is based on a Rydberg atom. A Rydberg atom is an atom with one or more electrons excited to a very high principal quantum number. These Rydberg atoms have several useful properties, such as very large dipole moments and long decay periods. These properties can be exploited to create an RF receiver that may receive and demodulate Amplitude-Modulated (AM), Frequency-Modulated (FM) and Phase Modulated (PM) RF electric fields over very large frequency ranges (e.g. from hundreds of MHz to 1 THz).

An example Rydberg-atom based RF receiver is shown in FIG. 1 and operates as follows. An atomic medium is provided which, in this example, is a glass cell filled with a low density vapor of alkali atoms (such as Rubidium-85). Each Rubidium-85 atom has a number of electron states, including the ground state (11>) and a plurality of excited states. The outer electron of the Rubidium-85 atom may be excited (e.g. by absorbing a photon of a particular wavelength) from the ground state (11>) to an excited state. The electron may then decay from the excited state to a lower excited state (that is, an excited state at a lower energy level) or to the ground state (11>). However, some of these transitions are not allowed as they are dipole forbidden.

In the RF receiver, a first laser (known as a "probe" laser) is passed through the atomic medium at a first wavelength which corresponds to the energy required to elevate the Rubidium-85 atom's outer electron from its ground state (11>) to a first excited state (12>). A second laser (known as a "coupling" laser) is also passed through the atomic medium in an opposing direction at a relatively large power level (compared to the probe laser) and at a second wavelength which corresponds to the energy required to elevate the Rubidium-85 atom's outer electron from the first excited state (12>) to a Rydberg state (13>). The transition from the Rydberg state (13>) to the ground state (11>) is forbidden so that the ground state (11>) becomes depopulated and so fewer atoms can absorb the probe laser operating at the first wavelength. Accordingly, the atomic medium becomes more transparent to the probe laser such that there is an increase in transmission of the probe laser, which is observable at an optical detector. This phenomenon is known as Electromagnetically Induced Transparency (EIT) and the received signal is known as the EIT signal. Specifically, the above description is of a ladder scheme EIT effect, but the skilled person would understand that the EIT effect may be realized through alternative electron transitions, such as the Vee and Lambda schemes.

Once the atomic medium has become transparent to the probe laser, then a further physical effect can be exploited to detect RF electric fields. As the Rubidium-85 atom's outer electron is much further away from the atomic nucleus when in the Rydberg state compared to the ground state, a large dipole moment is created and it becomes responsive to incident RF electric fields. An incident RF electric field may cause a further transition of an electron from the Rydberg state to an adjacent Rydberg state. If the transition from the adjacent Rydberg state to the ground state is not forbidden, then electrons may subsequently drop to the ground state so that the atomic medium becomes less transparent to the probe laser, causing a drop in amplitude of the EIT signal. This drop in amplitude of the EIT signal is directly proportional to the incident RF electric field's amplitude, thus creating a Rydberg-atom based AM RF receiver. Rydberg-atom based RF receivers have also been shown to detect frequency modulated and phase modulated RF fields. Regardless of the modulation scheme used, the Rydberg atom based RF detector may be configured to detect RF fields of a specific frequency by selecting a particular second wavelength of the coupling laser so that the electrons of the atomic medium are elevated to a particular Rydberg state. This Rydberg state is selected so that photons at the specific frequency to be detected will elevate electrons from this Rydberg state to its adjacent Rydberg state, creating a detectable change in the EIT signal that may be observed at the optical detector. The magnitude of the EIT signal, known as the "modulation depth", is the difference in the EIT signal when there is an incident RF electric field and when there is no incident RF electric field. In conventional systems where the EIT signal is based on the absorbance of the probe laser, the EIT signal is at its optimal modulation depth (i.e. thereby giving an optimal Signal to Noise Ratio (SNR)) when the frequency of the RF field matches (i.e. is "resonant" with) the energy required for the transition from this particular Rydberg state to its adjacent Rydberg state. As the frequency of the RF field deviates from the energy required for the transition from this particular Rydberg state to its adjacent Rydberg state (known as "RF dephasing"), then the magnitude of EIT signal decreases.

SUMMARY

According to a first aspect of the disclosure, there is provided a method of controlling an electromagnetic field detector, wherein the electromagnetic field detector is configured to: transmit a probe signal at a probe frequency in a first probe signal path and a second probe signal path to an optical receiver, wherein the first probe signal path passes through a transmission medium and the probe frequency is set to excite electrons of the transmission medium from a ground state to a first excited state; transmit a coupling signal at a coupling frequency in a first coupling signal path, wherein the first coupling signal path overlaps with the first probe signal path in the transmission medium in a first overlapping section, wherein the coupling frequency is set to excite electrons of the transmission medium to a predetermined excited state so as to induce an Electromagnetic Induced Transparency (EIT) effect in the transmission medium such that an incident electromagnetic field at the transmission medium causes a change in refractive index in the transmission medium at the first overlapping section such that there is a change in an optical path length difference between the first probe signal path and the second probe signal path; combine the first path of the probe signal, following its passage of the first overlapping section of the transmission medium, with the second path of the probe signal, such that the incident electromagnetic field at the first overlapping section is detectable, at the optical receiver, as a change in the intensity of the combined first and second paths of the probe signal caused by the change in the optical path length difference between the first probe signal path and the second probe signal path, the method comprising causing a first phase shift to be applied to the second probe signal path so as to cause a variation in the change in intensity of the combined first and second paths of the probe signal; obtaining data indicating a second phase shift to be applied to the second probe signal path so as to increase the change in intensity of the combined first and second paths of the probe signal, wherein the second phase shift is determinable from the variation in the change in intensity of the combined first and second paths of the probe signal caused by the first phase shift; and causing the second phase shift to be applied to the second probe signal path.

Obtaining data indicating the second phase shift may comprise monitoring the variation in the change in intensity of the combined first and second paths of the probe signal in response to the application of the first phase shift.

The first phase shift may include a first portion of the first phase shift in a first direction and a second portion of the first phase shift in a second direction, and monitoring the variation in the change in intensity may comprise determining that the first portion of the first phase shift in the first direction causes an increase in the change in intensity of the combined first and second paths of the probe signal, wherein the second phase shift is in the first direction.

The second phase shift may be one of a plurality of phase shifts applied to the second probe signal path iteratively until a termination condition is met.

The termination condition may be one of a group comprising: when the increase in the change in intensity of the combined first and second paths of the probe signal due to a phase shift of the plurality of phase shifts is less than a threshold, and when the change in intensity of the combined first and second paths of the probe signal due to a phase shift of the plurality of phase shifts is a decrease in the intensity of the combined first and second paths of the probe signal.

The first probe signal path may pass through the transmission medium in a plurality of passages, and the first coupling signal may overlap with the first probe signal path in the plurality of passages in a plurality of overlapping sections, and combining the first path of the probe signal with the second path of the probe signal may be following the first path of the probe signal's passage of all overlapping sections of the plurality of overlapping sections.

The method may further comprise monitoring the intensity of the combined first and second paths of the probe signal so as to demodulate information from the combined first and second paths of the probe signal.

The information may be modulated based on frequency modulation and demodulating information from the combined first and second paths may utilize a value of transmission power for the incident electromagnetic field.

The electromagnetic field may be a Radio Frequency (RF) field.

An interaction volume of an overlap of the coupling signal with the second probe signal path may be different to an interaction volume of the first overlapping section. The coupling signal may overlap with the second probe signal path in a second overlapping portion such that the incident electromagnetic field causes a change in refractive index in the transmission medium at the second overlapping portion, and an interaction volume of the second overlapping section may be different to the interaction volume of the first overlapping section.

The coupling signal may not overlap with the second probe signal path.

The electromagnetic field detector may includes a plurality of transmission media, the first probe signal path may pass through each transmission medium of the plurality of transmission media, the coupling signal may overlap with the first probe signal path in each transmission medium of the plurality of transmission media so as to induce an EIT effect in each transmission medium of the plurality of transmission media such that an incident electromagnetic field at each transmission medium of the plurality of transmission media causes a change in the refractive index of that transmission medium such that there is a change in the optical path length difference between the first probe signal path and the second probe signal path, and the first probe signal path may be combined, following its passage of each transmission medium of the plurality of transmission media, with the second probe signal path such that the incident electromagnetic field at each transmission medium of the plurality of transmission media is detectable, at the optical receiver, as a change in the intensity of the combined first and second paths of the probe signal caused by the change in the optical path length difference between the first probe signal path and the second probe signal path, the method may further comprise causing a first phase shift to be applied to the second probe signal path of each transmission medium of the plurality of transmission media so as to cause a variation in the change in intensity of the combined first and second paths of the probe signal; obtaining data indicating a second phase shift to be applied to the second probe signal path of each transmission medium of the plurality of transmission media so as to increase the change in intensity of the combined first and second paths of the probe signal, wherein the second phase shift is determinable from the variation in the change in intensity of the combined first and second paths of the probe signal caused by the first phase shift; and causing the second phase shift to be applied to the second probe signal path of each transmission medium of the plurality of transmission media.

According to a second aspect of the disclosure, there is provided a device for controlling an electromagnetic field detector, wherein the electromagnetic field detector is configured to: transmit a probe signal at a probe frequency in a first probe signal path and a second probe signal path to an optical receiver, wherein the first probe signal path passes through a transmission medium and the probe frequency is set to excite electrons of the transmission medium from a ground state to a first excited state, transmit a coupling signal at a coupling frequency in a first coupling signal path, wherein the first coupling signal path overlaps with the first probe signal path in the transmission medium in a first overlapping section, wherein the coupling frequency is set to excite electrons of the transmission medium to a predetermined excited state so as to induce an Electromagnetic Induced Transparency (EIT) effect in the transmission medium such that an incident electromagnetic field at the transmission medium causes a change in refractive index in the transmission medium at the first overlapping section such that there is a change in an optical path length difference between the first probe signal path and the second probe signal path, and combine the first path of the probe signal, following its passage through the first overlapping section of the transmission medium, and the second path of the probe signal such that the incident electromagnetic field at the first overlapping section is detectable, at the optical receiver, as a change in the intensity of the combined first and second paths of the probe signal caused by the change in the optical path length difference between the first probe signal path and the second probe signal path, wherein the device comprises a phase shift controller adapted to: cause a first phase shift to be applied to the second probe signal path so as to cause a variation in the change in intensity of the combined first and second paths of the probe signal; obtain data indicating a second phase shift to be applied to the second probe signal path so as to increase the change in intensity of the combined first and second paths of the probe signal, wherein the second phase shift is determinable from the variation in the change in intensity of the combined first and second paths of the probe signal caused by the first phase shift; and cause the second phase shift to be applied to the second probe signal path.

The phase shift controller may be adapted to monitor the variation in the change in intensity of the combined first and second paths of the probe signal in response to the application of the first phase shift.

The electromagnetic field detector may further comprise a processor configured to demodulate information from the combined first and second paths of the probe signal.

The transmission medium may include a metal vapor, which may be an alkali metal, which may be one of: Rubidium, Cesium or Strontium.

According to a third aspect of the disclosure, there is provided a computer program comprising instructions to cause the electromagnetic field detector of the second aspect of the disclosure to execute the method of the first aspect of the disclosure. The computer program may be stored on a computer-readable medium or carrier on a data carrier signal.

BRIEF DESCRIPTION OF THE DRAWINGS

In order that the present disclosure may be better understood, embodiments thereof will now be described, by way of example only, with reference to the accompanying drawings in which.

DETAILED DESCRIPTION OF EMBODIMENTS

Figure 1:
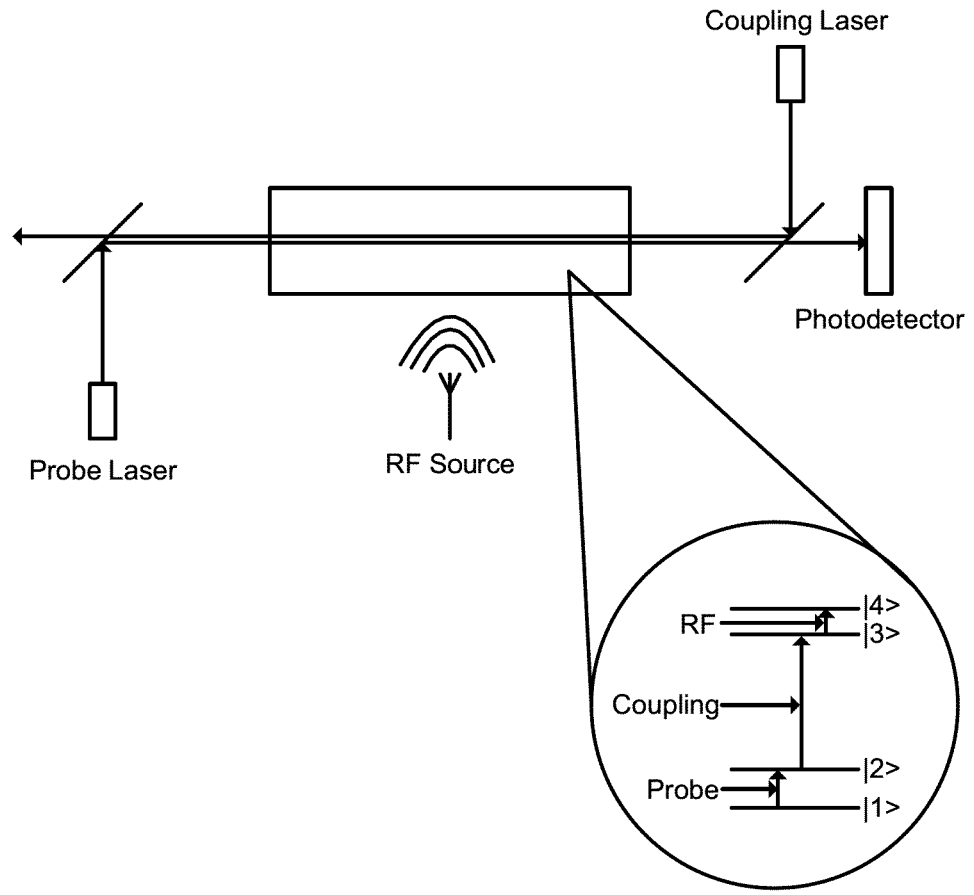
FIG. 1 is a schematic diagram of a conventional Rydberg-atom based Radio Frequency (RF) detector.

A first embodiment of a system 1 of the present disclosure will now be described with reference to FIG. 2. The system 1 includes a wireless transmitter 10 and a Radio-Frequency (RF) detector 20. In this embodiment, the wireless transmitter is configured to transmit wireless signals at a frequency of 3.46 GHz and at a transmission power of 15 microwatts, and the wireless transmitter 10 and RF detector 20 are 1 kilometer apart.

The RF detector 20 is a Rydberg-atom based RF detector and includes a first and second beam splitter 21a, 21b, probe laser 23, a first, second and third mirror 24a, 24b, 24c, a coupling laser 25, a first and second frequency-dependent mirror 26a, 26b, a vapor cell 27 containing a low-density vapor of alkali metal (in this embodiment, Rubidium-85), a first and second filter 28a, 28b, and a photodetector 29. In the Figures, a solid line represents the probe laser 23 only (i.e. where it does not overlap with any other laser, such as the coupling laser 25) and a dashed line represents the coupling laser 25 only (i.e. where it does not overlap with any other laser, such as the probe laser 23).

The RF detector 20 is arranged as an interferometer (more specifically, a Michelson-type interferometer) in which the probe laser 23 is split into two paths, one of which passes through the vapor cell 27 where it overlaps with a first and second path of the coupling laser 25. This will now be described in more detail.

The probe laser 23 passes through the first beam splitter 21a such that the probe laser 23 is split into a first part that is directed along a first path and a second part that is directed along a second path (in this embodiment, the split is 50:50). The first path of the probe laser 23 passes through the first filter 28a, passes through a first portion of the vapor cell 27, passes through a first frequency-dependent mirror 26a (which does not reflect the probe laser 23), is reflected off a first mirror 24a, passes the second filter 28b, passes through a second portion of the vapor cell 27, passes through a second frequency-dependent mirror 26b (which does not reflect the probe laser 23) and terminates at the photodetector 29. The first path of the probe laser 23 may interact with the Rubidium-85 atoms of the vapor cell 27 within the first and second portions, such as by exciting electrons from a ground state to a first excited state. The second path of the probe laser 23 passes through a phase shift controller 30, is reflected off the second and third mirrors 24b, 24c and terminates at the photodetector 29. For completeness, it is noted that the second path of the probe laser 23 does not pass through the vapor cell 27 and therefore does not interact with Rubidium-85 atoms in the vapor cell 27.

At the photodetector 29, the first path of the probe laser 23 and the second path of the probe laser 23 combine and interfere. Assuming a stable optical path length difference between the first and second paths (to within a fraction of a wavelength of the probe laser 23 for the duration of the photodetector's measurement) then coherent interference will occur and the intensity of the probe laser 23 at the photodetector 29 will remain stable (that is, have a constant value). In this embodiment, the optical path length difference between the first and second paths corresponds with an nπ phase difference (where n is an even number) such that constructive interference occurs and the intensity of the combined first and second paths of the probe laser 23 at the photodetector 29 is maximized. As explained below, the RF detector 20 may be operated so that the intensity of the probe laser 23 changes upon an incident RF signal at the vapor cell 27.

The coupling laser 25 passes through the second beam splitter 21b such that the coupling laser 25 is split into a first part that is directed along a first path and a second part that is directed along a second path (in this embodiment, the split is 50:50). The first path of the coupling laser 25 is reflected by the first frequency-dependent mirror 26a such that it passes through the first portion of the vapor cell 27 and terminates at the first filter 28a. The second path of the coupling laser 25 is reflected by the second frequency-dependent mirror 26b such that is passes through the second portion of the vapor cell 27 and terminates at the second filter 28b. The coupling laser 25 may also interact with the Rubidium-85 atoms of the vapor cell 27 within the first and second portions, such as by exciting electrons from the first excited state to a predetermined Rydberg state.

The probe laser 23 and coupling laser 25 are therefore overlapping in the first portion and second portion of the vapor cell 27, such that Rubidium-85 atoms within these first and second portions interact with both the probe laser 23 and coupling laser 25. In the Figures, the overlapping portions of the probe laser 23 and coupling laser 25 are represented by a long dash short dash line. An Electromagnetically Induced Transparency (EIT) effect may therefore be experienced by these atoms in the first and second portions of the vapor cell 27. In this embodiment, the first portion of the vapor cell 27 is 0.05 m long and the second portion of the vapor cell 27 is 0.05 m long, so the EIT effect may be experienced within a combined distance of 0.1 m in these first and second portions of the vapor cell 27.

The RF detector 20 may be operated so as to detect an RF signal transmitted by the wireless transmitter 10 that is incident upon the vapor cell 27. This is achieved by configuring the probe laser 23 to transmit a probe signal (which is split by the first beam splitter 21a so that the first path of the probe signal passes through the first and second portions of the Rubidium-85 vapor cell 27) and by further configuring the coupling laser 25 to transmit a coupling signal (which is split by the second beam splitter 21b so that the first path of the coupling signal passes through the first portion of the Rubidium-85 vapor cell 27 and the second path of the coupling signal passes through the second portion of the Rubidium-85 vapor cell 27). The frequency of the probe signal is set to correlate with the transition of an electron of a Rubidium-85 atom from a ground state to a first excited state, and the frequency of the coupling signal is set to correlate with the transition of an electron of a Rubidium-85 atom from the first excited state to a predetermined Rydberg state. In this embodiment in which the RF detector 20 is configured to detect 3.46 GHz wireless signals from the wireless transmitter 10, the probe signal is set to 780 nm and the coupling signal is set to 480 nm so that electrons are excited to the predetermined Rydberg state having the 84th principal quantum number. In this configuration, wireless signals transmitted by the wireless transmitter 10 at 3.46 GHz that pass through the vapor cell 27 will excite electrons from this predetermined Rydberg state to an adjacent Rydberg state. As explained in detail below, the RF signal exciting electrons from this predetermined Rydberg state to the adjacent Rydberg state will cause a change in the refractive index of the first and second portions of the vapor cell 27. As the first path of the probe laser 23 passes through these first and second portions of the vapor cell 27, whilst the second path of the probe laser 23 does not pass through the vapor cell 27, then the incident RF signal at 3.46 GHz from the wireless transmitter 10 causes a change in an optical path length of the first path of the probe laser 23 but does not cause a change in an optical path length of the second path of the probe laser 23. Accordingly, there is change in an optical path length difference (and therefore phase as measured at the photodetector 29) between the first and second paths at a time of the RF signal being incident upon the vapor cell 27 relative to the optical path length difference between the first and second paths at a time when there is no RF signal incident upon the vapor cell 27. The combination of the first and second paths of the probe laser 23 at the photodetector 29 when the RF signal from the wireless transmitter 10 is incident upon the vapor cell 27 will therefore be different to the combination of the first and second paths of the probe laser 23 at the photodetector 29 when there is no RF signal incident upon the vapor cell 27. By monitoring the intensity of the combination of the first and second paths of the probe laser 23 at the photodetector 29, the RF signal may be detected as a change in the intensity value from a stable reference value as the RF signal passes through the vapor cell 27 and causes a change in the refractive index of the first and second portions of the vapor cell 27 and thus a change in the optical path length difference of the first and second paths of the probe laser 23.

The phase shift controller 30 is configured to apply a particular phase shift (within a range of possible phase shifts) to the second path of the probe laser 23. This is achieved, in this embodiment, by the second path of the probe laser 23 passing through a material having a refractive index that may be varied by applying a controllable bias voltage. The material may be a non-linear crystal, such as a liquid crystal, lithium niobate (LiNbO3), magnesium-oxide-doped lithium niobate (MgO:LiNbO3), RTP (Rubidium Titanyl Phosphate) or KTP (potassium titanyl phosphate). The phase shift applied to the second path of the probe laser 23 is a function of this bias voltage, such that as the bias voltage is increased, the second path of the probe laser 23 is phase shifted in a first direction (relative to the phase of the second path of the probe laser 23 when no phase shift is applied), and as the bias voltage is decreased, the second path of the probe laser 23 is phase shifted in a second direction (relative to the phase of the second path of the probe laser 23 when no phase shift is applied). In this embodiment, the bias voltage applied to the second path of the probe laser 23 has a central bias voltage and is modulated such that the bias voltage cycles (at a modulation frequency) between an upper bias voltage and a lower bias voltage.

The central bias voltage, modulation frequency, upper bias voltage and lower bias voltage are all configurable. The central bias voltage, modulation frequency, upper bias voltage and lower bias voltage may all be configured with zero values, such that no bias voltage is applied to the second path of the probe laser 23 and no phase shift is thereby applied to the second path of the probe laser 23. The central bias voltage, modulation frequency, upper bias voltage and lower bias voltage may alternatively be configured with non-zero values such that the second path of the probe laser 23 cycles between a first phase shift in the first direction (when the bias voltage has a value between the central bias voltage and the upper bias voltage) and a second phase shift in the second direction (when the bias voltage is between the central bias voltage and the lower bias voltage).

In this embodiment, the bias voltage has a sinusoidal form and the modulation frequency is in a range of 10 kHz to 100 kHz. The upper and lower bias voltages are configured such that the phase shift applied to the second path of the probe laser 23 is less than 2σ.

The phase shift controller 30 is connected to the photodetector 29 to enable the phase shift controller 30 to analyze the intensity of the combined first and second paths of the probe laser 23 at the photodetector 29 and determine the bias voltage to apply to the second path of the probe laser 23 (which is described in more detail below). An embodiment of a method of the present disclosure will now be described, with reference to the system of FIG. 2 and the flow diagram of FIG. 3. In S101, the RF detector 20 is operated so that the probe laser 23 and coupling laser 25 produce an EIT effect in the vapor cell 27. The probe laser 23 is configured such that the probe frequency is on resonance with its electron transition and the coupling laser 25 is configured such that the coupling frequency is on resonance with its electron transition. Stabilizers (not shown) may be used to stabilize the probe laser 23 and coupling laser 25 at their respective probe and coupling frequencies. The phase shift controller 30 is configured such that the bias voltage is zero (i.e. the central bias voltage, modulation frequency, upper bias limit and lower bias limit are all zero) and therefore no phase shift is applied to the second path of the probe laser 23.

As discussed above, a first path of the probe laser 23 passes through the vapor cell and is subject to the EIT effect, whilst a second path of the probe laser 23 does not pass through the vapor cell and is not subject to the EIT effect. In this state, an RF signal incident at the vapor cell may be detected as a change in intensity of the combined first and second paths of the probe laser 23 as monitored at the photodetector 29. The difference between the intensity of the combined first and second paths of the probe laser 23 when there is no RF signal incident at the vapor cell and the intensity of the combined first and second paths of the probe laser 23 when there is an RF signal incident at the vapor cell is known as the "modulation depth". Detection of the RF signal may therefore be a comparison of the modulation depth to a threshold. This threshold may be calibrated to be greater than a typical noise level in the system. The following enable the RF detector 20 to maximize (or at least increase) the modulation depth of the combined first and second paths of the probe laser 23 so as to increase its sensitivity for detecting RF signals.

In S103, the phase shift modulator 30 is configured to apply a phase shift to the second path of the probe laser 23 by applying a bias voltage in which the central bias voltage is zero and the upper bias limit, lower bias limit and modulation frequency are all non-zero (the first modulation frequency being relatively low compared to the frequency of the RF signal—for example, the frequency of the RF signal may be 10 times to 100 times greater than the first modulation frequency). As noted above, as the bias voltage cycles between the upper bias limit and the lower bias limit, the phase shift applied to the second path of the probe laser 23 cycles between a first phase shift in the first direction and a second phase shift in the second direction. The magnitude of the phase shift is proportional to the bias voltage being applied. These variations in phase of the second path of the probe laser 23 result in the first and second paths of the probe laser 23 interfering differently when they combine (compared to the interference that would have occurred if no phase shift was applied to the second path of the probe laser 23), and therefore different levels of intensity of the combined first and second paths of the probe laser 23 at the photodetector 29 (compared to the intensity if no phase shift was applied to the second path of the probe laser 23).

In S105, the intensity of the combined first and second paths of the probe laser 23 is monitored at the photodetector 29 to detect variations in its modulation depth. Variations in the modulation depth that occur at the same frequency as the modulation frequency of the bias voltage are caused by the phase shift being applied to the second path of the probe laser 23. These variations can therefore be analyzed in isolation from any changes in modulation depth due to the presence of an RF signal (which occur at a much higher frequency). In S107, it is determined whether the variations in modulation depth (occurring at the modulation frequency) that occur during a first time period when the phase shift is in the first direction (that is, when the bias voltage is in a range between the central bias voltage and the upper bias limit) or whether the variations in modulation depth that occur during a second time period when the phase shift is in the second direction (that is, when the bias voltage is in a range between the central bias voltage and the lower bias limit) result in a greater modulation depth.

In S109, the central bias voltage is adjusted in the direction corresponding with the improved modulation depth (that is, if the modulation depth increased during the first time period, then the central bias voltage is increased in the direction of the upper bias limit; and if the modulation depth increased during the second time period, then the central bias voltage is decreased in the direction of the lower bias limit). The adjustment is applied iteratively until a termination condition is met. In this embodiment, this termination condition is when the most recent adjustment results in a decrease in the modulation depth. Alternatively, the termination condition may be when the most recent adjustment results in a change in the modulation depth that is less than a threshold.

The adjustments to the central bias voltage in each step may have the same magnitude or may decrease in magnitude (that is, as the step count increases, the magnitude of the central bias voltage adjustment decreases). By decreasing the magnitude of each adjustment, the method may more accurately find the optimum bias voltage corresponding with the optimum modulation depth. Once the termination condition has been met, the process then loops back to S105 to monitor for further variations in the intensity of the combined first and second paths of the probe laser 23 and re-adjust the phase shift of the second path of the probe laser 23 (which may be necessary due to a change in the RF signal's power and/or frequency, for example due to a Doppler shift).

In this embodiment in which the RF detector 20 has a nπ phase difference (where n is an even number) between the first and second paths of the probe laser 23 such that there is constructive interference of the combined first and second paths at the photodetector, then the feedback loop results in the phase shift controller 30 applying a phase shift to the second path of the probe laser 23 so as to realize destructive interference of the combined first and second paths of the probe laser 23 and therefore the maximum variation in modulation depth. This feedback loop is introduced by applying a controllable phase shift to the path of the probe laser 23 that is unaffected by the change in refractive index of the vapor cell 27, and adjusting the phase shift until the modulation depth is suitably increased or maximized.

Figure 4A:
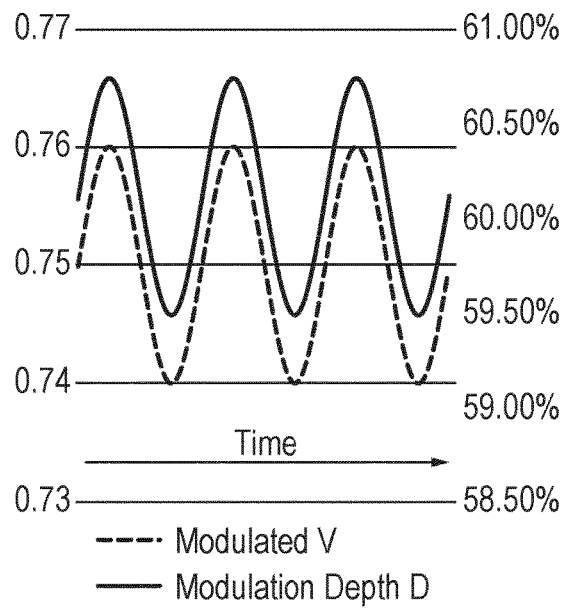
FIGS. 4a to 4c are graphs illustrating an operation of the embodiment of FIG. 3.
Figure 4B:
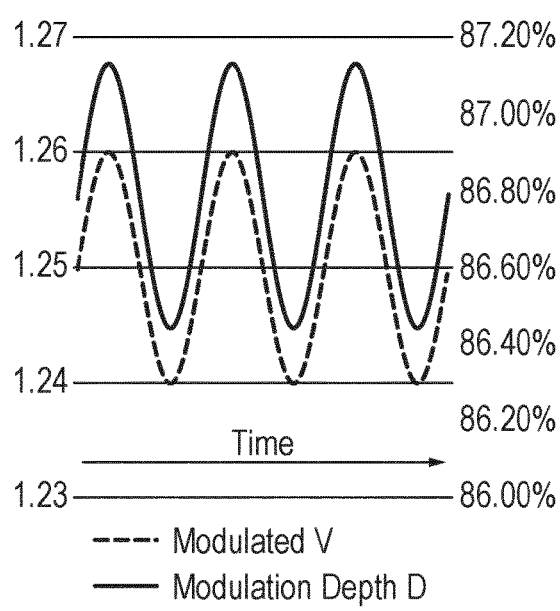
Figure 4C:
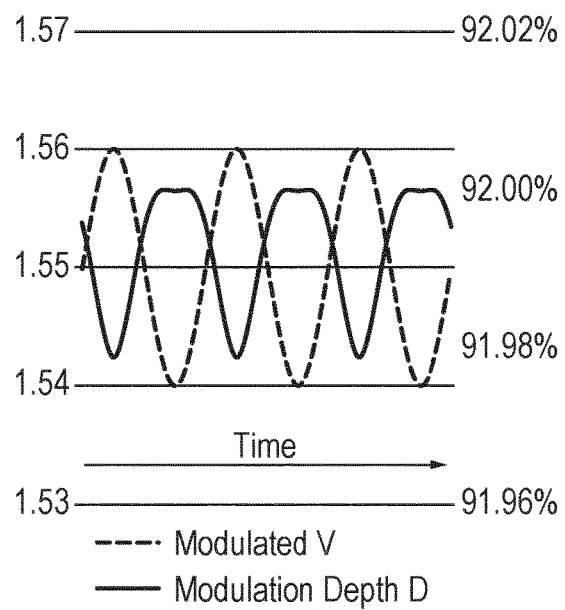

FIGS. 4a to 4c illustrate three iterations of S109. In FIG. 4a, a central bias voltage of 0.75V is applied by the phase shift controller 30, which results in the modulation depth varying over a range of 1.26% in-phase with the bias voltage. In FIG. 4b, the central bias voltage has been increased to 1.25V, and the modulation depth now varies over a range of 0.69% (that is, the magnitude of the variation has decreased), again in-phase with the bias voltage. In FIG. 4c, the central bias voltage has been increased to 1.55V. The modulation depth is now out-of-phase with the bias voltage and varies over a range of 0.02%. In this example, the optimal value for the central bias voltage (corresponding with the maximized modulation depth) was 1.54V. As the central bias voltage was increased up to the optimal value, the magnitude of the modulation depth variation decreased but remained in-phase with the bias voltage. As the central bias voltage surpassed the optimal value, the modulation depth variation switched to being out-of-phase with the bias voltage and decreased with increasing bias voltage.

This first embodiment represents one embodiment of a Rydberg-atom based RF detector that exploits a change in the refractive index of the vapor cell 27 in order to detect an incident RF signal. This is achieved by using an interferometric design where, upon receiving an RF signal at the vapor cell 27, one path of a probe laser 23 is affected by the change in refractive index of the vapor cell 27 whereas another path of the probe laser 23 is unaffected by the change in refractive index of the vapor cell 27. This is a major departure from the prior art designs of Rydberg-atom based RF detectors that exploit a change in absorbance of the vapor cell 27.

Furthermore, the first embodiment above introduces a feedback loop to the RF detector 20 so that the modulation depth may be maximized, or at least increased, increasing sensitivity (and therefore bandwidth) of the RF detector 20. This solves the problem of optimizing modulation depth without having to separately detune the probe and/or coupling frequencies of the RF detector 20 from their respective resonant frequencies.

It will be shown in the following theoretical analysis that the Rydberg-atom based RF detector based on the change in refractive index of the vapor cell 27 has an unusual response to an incident RF signal in that a modulation depth (that is, the difference in intensity of the probe laser 23, as measured by the photodetector 29, when an RF signal is incident on the vapor cell 27 and when there is no RF signal incident on the vapor cell 27) is zero when the RF signal is resonant with the frequency required to elevate an electron from the predetermined Rydberg state to the adjacent Rydberg state. However, when the RF signal is off-resonance (i.e. the frequency of the RF signal is not equal to the frequency required to elevate an electron from the predetermined Rydberg state to the adjacent Rydberg state), then it performs better than the prior art Rydberg-atom based RF detector based on the change in absorbance.

The following description presents a theoretical analysis of the RF detector 20. As noted above, the Rubidium-85 atoms in the overlapping probe laser 23 and coupling laser 25 in the first and second portions of the vapor cell 27 may experience an EIT effect. In particular, this EIT effect may be experienced according to a ladder EIT configuration in which the probe laser 23 excites electrons from a ground state to a first excited state (using, for example, a 780 nm probe signal) and the coupling laser 25 excites electrons from the first excited state to a predetermined Rydberg state (using, for example, a 480 nm coupling signal). The electric susceptibility, $\chi$, of these Rubidium-85 atoms when experiencing the EIT effect in the ladder EIT configuration is given by:

$$\chi = -\left(2N|\wp_{12}|^2/\varepsilon_0 \tilde{h}\right) \{(2(\Delta_p + \Delta_c) + i\Gamma_3)(2(\Delta_p + \Delta_c + \Delta_r) + i\Gamma_4) - \Omega_r^2\}/$$
$$\left[\{(2(\Delta_p + \Delta_c) + i\Gamma_3)(2(\Delta_p + \Delta_c + \Delta_r) + i\Gamma_4) - \Omega_r^2\}(2\Delta_p + i\Gamma_2) - \right.$$
$$\left. \Omega_c^2(2(\Delta_p + \Delta_c + \Delta_r) + i\Gamma_4)\right]$$

In which:
N is the number of atoms engaged in the interaction,
$|\wp_{12}|$ is the transition dipole moment of the first transition (between the ground state and the first excited state),
$\varepsilon_0$ is the electric permittivity of free space,
$\tilde{h}$ is the reduced Planck constant,
$\Delta_p$, $\Delta_c$ and $\Delta_r$ are the differences in angular frequency of the probe, coupling and RF signals to their corresponding resonant atomic transition frequencies (that is, the frequency required to elevate an electron from the ground state to the first excited state, the frequency required to elevate an electron from the first excited state to the predetermined Rydberg state, and the frequency required to elevate an electron from the predetermined Rydberg state to the adjacent Rydberg state),
$\Gamma_2$, $\Gamma_3$ and $\Gamma_4$ are the transition rates out of the first excited state, the predetermined Rydberg state, and the adjacent Rydberg state respectively, and
$\Omega_r$ and $\Omega_c$ are the Rabi frequencies of the RF and coupling signals, which is the product of the E-field amplitude and the relevant transition dipole moment divided by the reduced Planck constant.

The refractive index of the Rubidium-85 atoms in the vapor cell 27 that experience the EIT effect is described by the real-part of this complex electric susceptibility. It is useful to define some intermediate expressions as:

$$B = \Gamma_3 \Gamma_4 - 4(\Delta_p + \Delta_c)(\Delta_p + \Delta_c + \Delta_r) + \Omega_r^2$$

$$C = \Gamma_3(\Delta_p + \Delta_c + \Delta_r) + \Gamma_4(\Delta_p + \Delta_c)$$

$$S = \Omega_c^2 \Gamma_4 + B\Gamma_2 - 4\Delta_p C$$

$$T = \Omega_c^2(\Delta_p + \Delta_c + \Delta_r) + C\Gamma_2 + \Delta_p B$$

$$k = \left(2N|\wp_{12}|^2/\varepsilon_0 \tilde{h}\right)$$

Such that the complex electric susceptibility is given by:

$$\chi = k\{2(CS - BT) + i(BS + 4CT)\}/(S^2 + 4T^2) = D + iA$$

Hence, the real part of the electric susceptibility is:

$$D = 2k(CS - BT)/(S^2 + 4T^2)$$

A modulation depth, M, may be defined as the difference in intensity of the probe laser 23, as measured by the photodetector 29, when an RF signal is incident on the vapor cell 27 and when there is no RF signal incident on the vapor cell 27:

$$M = D - D_0$$

It is desirable to maximize the modulation depth, M, so that the intensity change upon an incident RF signal at the vapor cell 27 is maximized and easier to detect. If the probe laser 23 is stabilized to the frequency required to elevate electrons from the ground state to the first excited state (i.e. $\Delta_p=0$) and the coupling laser 25 is stabilized to the frequency required to elevate electrons from the first excited state to the predetermined state (i.e. $\Delta_c=0$), it can be shown that:

$$(S^2 + 4T^2)M = -2k\Delta_r\Omega_r^2\Omega_c^2$$

Furthermore, it can be shown that the modulation depth, M, can be maximized with respect to the power of the coupling laser 25 (as represented by $\Omega_c^2$) when:

$$\Gamma_2^2\{(\Gamma_3\Gamma_4 + \Omega_r^2)^2 + 4\Delta_r^2\Gamma_3^2\} = (4\Delta_r^2 + \Gamma_4^2)\Omega_c^4$$

So for any particular RF power, there is an optimum value of the power of the coupling laser 25. However, as the RF power is unknown, possibly variable and likely to be very weak (in many use cases of Rydberg-atom based RF detectors), then the power of the coupling laser 25 may be set based on a negligible RF power, such that $\Omega_r^2=0$, and $\Omega_c^2=\Gamma_2\Gamma_3$.

In this circumstance, where $\Delta_p=\Delta_c=0$ and $\Omega_c^2=\Gamma_2\Gamma_3$, the modulation depth, M, in the real part of the electric susceptibility is:

$$M = -2k\Gamma_3\Delta_r\Omega_r^2/\Gamma_2\{(2\Gamma_3\Gamma_4 + \Omega_r^2)^2 + (4\Gamma_3\Delta_r)^2\}$$

This indicates that the modulation depth for an RF detector based on the refractive index is proportional to $\Delta_r^{-1}$ (the difference in frequency of the RF signal to the corresponding resonant atomic transition frequency of an electron from the Rydberg state to the adjacent Rydberg state). In contrast, the modulation depth for an RF detector based on the absorbance is proportional to $\Delta_r^{-2}$. Accordingly, an RF detector based on the refractive index is better suited for detecting RF signals where there is greater RF dephasing.

Figure 2:
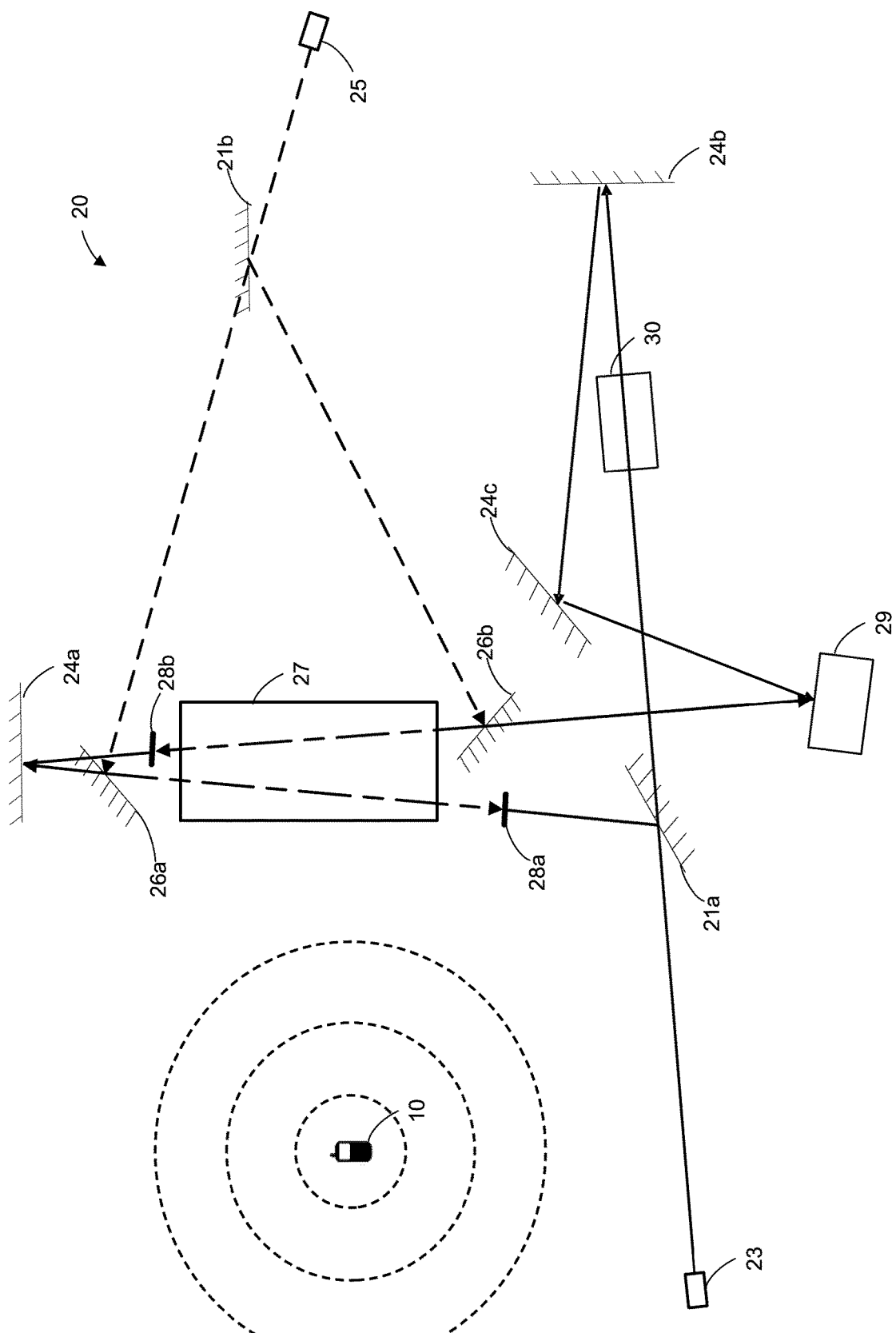
FIG. 2 is a schematic diagram of a Rydberg-atom based RF detector of a first embodiment of the present disclosure.
Figure 5:
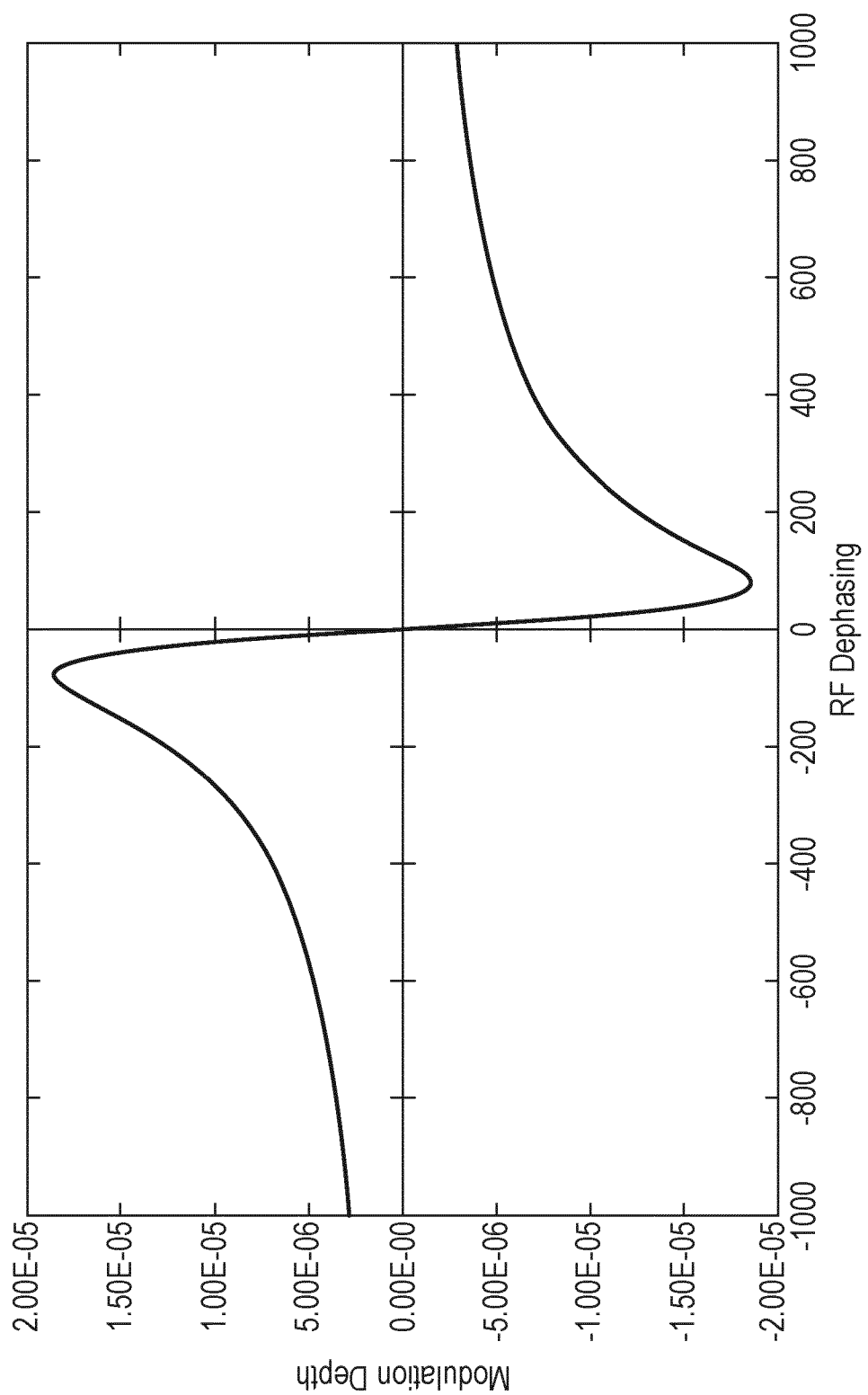
FIG. 5 is a graph illustrating modulation depth against RF dephasing for the RF detector of FIG. 2.

FIG. 5 shows how the modulation depth varies as a function of RF dephasing for the system shown in FIG. 2. This graph shows that the modulation depth is zero when RF dephasing is zero (in other words, the frequency of the RF signal is exactly 3.46 GHz such that it exactly matches the energy required to excite an electron from the Rydberg state to the adjacent Rydberg state), indicating that the RF detector 20 is not suited to detecting RF signals at the resonant frequency. However, the modulation depth is non-zero where the RF dephasing is non-zero, indicating that the RF detector 20 is suited to detecting RF signals that are not at the resonant frequency. This contrasts with the conventional Rydberg-atom based RF receiver that exploits changes in probe signal absorption that have a maximum modulation depth when the incident RF signal is at the resonant frequency.

FIG. 5 further illustrates that there are two modulation depth maxima where the RF dephasing is at ±100 kHz, with the modulation depth decaying as the RF dephasing increases above +100 kHz or decreases below −100 kHz. As discussed above, the modulation depth decays at a lower rate with greater RF dephasing relative to the modulation depth decay rate with greater RF dephasing for the conventional Rydberg-atom based RF detector (exploiting absorption of the probe signal).

FIG. 5 also illustrates that the modulation depth is at an order of magnitude of $10^{-5}$ in this scenario. It is known that interferometer arrangements, such as the Michelson type arrangement shown in FIG. 2, can measure refractive index to an order of magnitude of $10^{-9}$ (see, for example, article "Absolute refractometry of dry gas to ±3 parts in $10^9$", Patrick Egan et al., Appl. Opt. 50, 3076-3086 (2011)). Such interferometer arrangements may therefore detect modulation depth changes (due to a change in refractive index of the Rubidium-85 atoms experiencing the EIT effect in the vapor cell 27) to an order of magnitude of approximately $10^{-8}$ (as a change in refractive index of a material results in double the change in the real part of the material's electric susceptibility). The RF detector 20 of the above embodiment may therefore detect RF signals with an RF dephasing of many megahertz either side of the resonant frequency. If the system noise is sufficiently low, then it would be possible to detect RF signals with an RF dephasing up to a midpoint between 1) the frequency required to elevate an electron from the Rydberg state of the $n^{th}$ principal quantum number to an adjacent Rydberg state and 2) the frequency required to elevate an electron from the Rydberg state of the $(n+1)^{th}$ principal quantum number to an adjacent Rydberg state, or the midpoint between 1) the frequency required to elevate an electron from the Rydberg state of the $n^{th}$ principal quantum number to an adjacent Rydberg state and 2) the frequency required to elevate an electron from the Rydberg state of the $(n-1)^{th}$ principal quantum number to an adjacent Rydberg state. For example, consider the system in which the probe and coupling signals are set to elevate electrons to the Rydberg state having the $84^{th}$ principal quantum number such that an RF signal of 3.46 GHz will elevate an electron to the adjacent Rydberg state having the $85^{th}$ principal quantum number. If the system noise is sufficiently low, then the system may detect such an RF signal in the range 3.3985 GHz to 3.5245 GHz, in which 3.3985 GHz is the midpoint between the resonant frequency for the electron transition from the $85^{th}$ principal quantum number to the $86^{th}$ principal quantum number (3.337 GHz) and the resonant frequency for the electron transition from the $84^{th}$ principal quantum number to the $85^{th}$ principal quantum number (3.460 GHz), and in which 3.5245 GHz is the midpoint between the resonant frequency for the electron transition from the $83^{rd}$ principal quantum number to the $84^{th}$ principal quantum number (3.589 GHz) and the resonant frequency for the electron transition from the $84^{th}$ principal quantum number to the 85th principal quantum number (3.460 GHz). Once the frequency of the RF signal goes below 3.3985 GHz or above 3.5245 GHz, then the coupling signal may be set to the next respective Rydberg state (i.e. the Rydberg state of the $83^{rd}$ principal quantum number if the frequency of the RF signal goes above 3.5245 GHz and the Rydberg state of the $85^{th}$ principal quantum number if the frequency of the RF signal goes below 3.3985 GHz) so as to increase the modulation depth on receipt of that RF signal (relative to the modulation depth if the system is not recalibrated).

The following further theoretical analysis illustrates that the phase shift of the second path of the probe laser 23 can be adjusted so as to modify the modulation depth of the intensity of the combined first and second paths of the probe laser 23.

The electric susceptibility $\chi$ of the vapor cell is directly related to its refractive index, n, as:

$$n^2 = 1 + \chi$$

The electric susceptibility has a real component and an imaginary component. The refractive index also has a real component and an imaginary component. The real component of the electric susceptibility is proportional to the dispersion of the vapor cell and the imaginary component is the absorbance of the vapor cell. The absorbance directly determines how much of the incident light is transmitted through the vapor cell.

The refractive index, n, may be defined in terms of its real and imaginary components thus:

$$n = \mathrm{Re}\,(n) + i\,\mathrm{Im}\,(n)$$

As the probe laser 23 (having amplitude A and intensity proportional to $A^2$) propagates along the first path, part of which is through the vapor cell, the E-field of the first path of the probe laser 23 may be defined as a function of the distance as:

$$E_1 = A \exp(i\ nkx) = A \exp(-\mathrm{Im}\,(n)kx)\exp(i\ \mathrm{Re}\,(n)kx)$$

In which the probe wavenumber, k, is equal to $2\square\square\square$ and x is the total length of the overlapping portions of the probe and coupling lasers in the vapor cell.

As the probe laser 23 (having amplitude A and intensity proportional to $A^2$) propagates along the second path, the E-field of the second path of the probe laser 23 may be defined as a function of the distance as:

$$E_2 = A \exp(ikx)\exp(i\Phi)$$

In which $\Phi$ is the phase shift applied to the second path of the probe laser 23.

It is noted that the E-field of the second path is a function of x, the total length of the overlapping portions of the probe and coupling lasers in the vapor cell, even though the second path of the probe laser 23 does not pass through the vapor cell. The first and second paths of the probe laser 23 may have different lengths, but the paths only experience different dispersion and attenuation during portions of each path having a length equal to x. Outside of these portions, the paths experience the same conditions and therefore accumulate the same phase shifts and attenuation as each other until they are combined.

When the first and second paths of the probe laser 23 combine, the E-field is represented as:

$$E_1 + E_2 = A\{\exp(-\mathrm{Im}\,(n)kx)\exp(i(\mathrm{Re}\,(n)kx)) + \exp(i(kx+\Phi))\}$$

The power (and therefore intensity) of the combined first and second paths of the probe laser 23, as detected at the photodetector is therefore defined as:

$$|E_1 + E_2|^2 =$$
$$A^2\{\exp(-2\,\mathrm{Im}\,(n)kx) + 1 + 2\exp(-\mathrm{Im}\,(n)kx)\cos((\mathrm{Re}\,(n-1)kx-\Phi))\}$$

The modulation depth due to the presence of the RF signal at the vapor cell, Mint, may then be defined as:

$$M_{int} = (|E_1 + E_2|_0^2 - |E_1 + E_2|^2)/2A^2$$
$$= [M_{att} + 2\exp(-\mathrm{Im}\,(n_0)kx)\cos$$
$$((\mathrm{Re}\,(n_0-1)kx-\Phi) - 2\exp(-\mathrm{Im}\,(n)kx)\cos((\mathrm{Re}\,(n-1)kx-\Phi)]/2$$

It is therefore possible to choose $\Phi$ to maximize Mint by differentiating Mint with respect to $\Phi$ as:

$$\exp(-\mathrm{Im}\,(n_0)kx)\sin((\mathrm{Re}\,(n_0-1)kx-\Phi)) =$$
$$\exp(-\mathrm{Im}\,(n)kx)\sin((\mathrm{Re}\,(n-1)kx-\Phi))$$

and rearranging for $\Phi$:

$$\Phi = \arctan\big[\{\exp(-\mathrm{Im}\,(n_0-n)kx)\sin(\mathrm{Re}\,(n_0-1)kx) -$$
$$\sin(\mathrm{Re}\,(n-1)kx)\}/\{\exp(-\mathrm{Im}\,(n_0-n)kx)$$
$$\cos(\mathrm{Re}\,(n_0-1)kx) - \cos(\mathrm{Re}\,(n-1)kx)\}\big]$$

In summary, therefore, it is possible to select @ so as to maximize modulation depth.

The system described above implements an interferometer to detect a change in intensity between two paths of a laser split into two paths, whereby one path of the laser acts as a probe signal in a Rydberg-atom based RF detector and the other path of the laser does not act as a probe signal in a Rydberg-atom based RF detector, due to the change in phase (and therefore optical path length) between the two paths due to the presence of an RF signal at the Rydberg-atom based RF detector. This change in intensity may be recorded as a detection of the RF signal. The particular arrangement used in the above embodiment is an example of a Michelson type interferometer. However, the skilled person will understand that any form of interferometer may be used instead in which the interferometer is designed to detect a change in optical path length between two paths of the probe laser. These interferometer designs include Fabry-Perot, Mach-Zehnder, Sagnac, and Fizeau configurations. These interferometer designs all operate on the principle of combining two laser signals of the same frequency so that the interference pattern of the combined signals is determined by the phase difference between the two signals. This property may therefore be exploited so that an RF signal causes the phase difference, as described above, so that a change in the interference pattern (and therefore the intensity) of the combined signal may be recorded as a detection of the RF signal.

Figure 6:
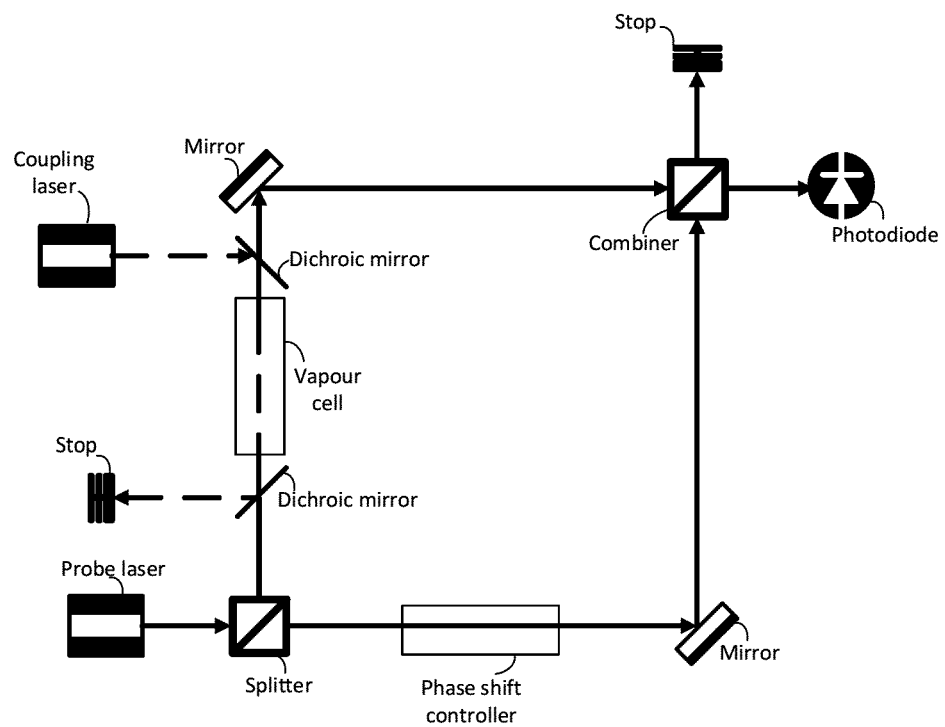
FIG. 6 is a schematic diagram of a Rydberg-atom based RF detector of a second embodiment of the present disclosure.
Figure 7:
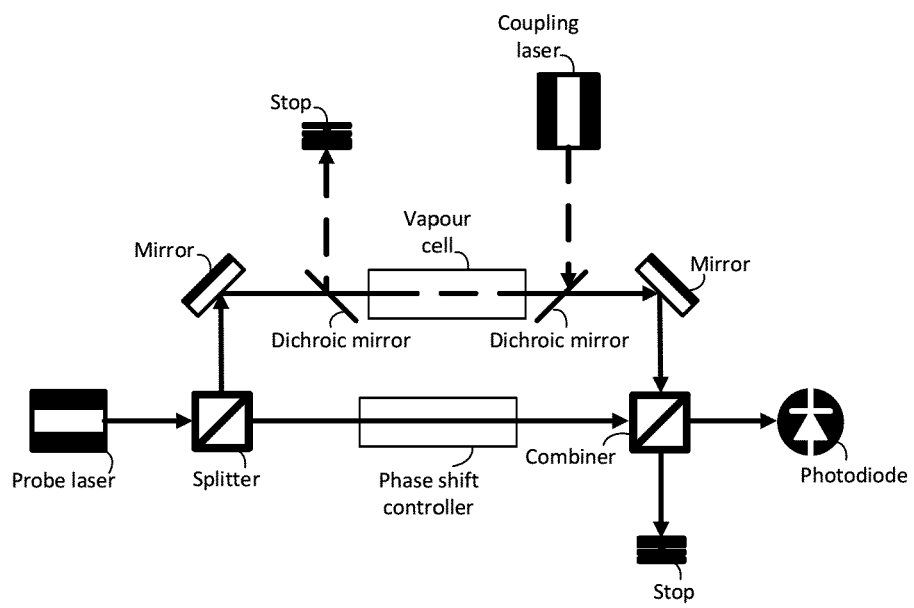
FIG. 7 is a schematic diagram of a Rydberg-atom based RF detector of a third embodiment of the present disclosure.
Figure 8:
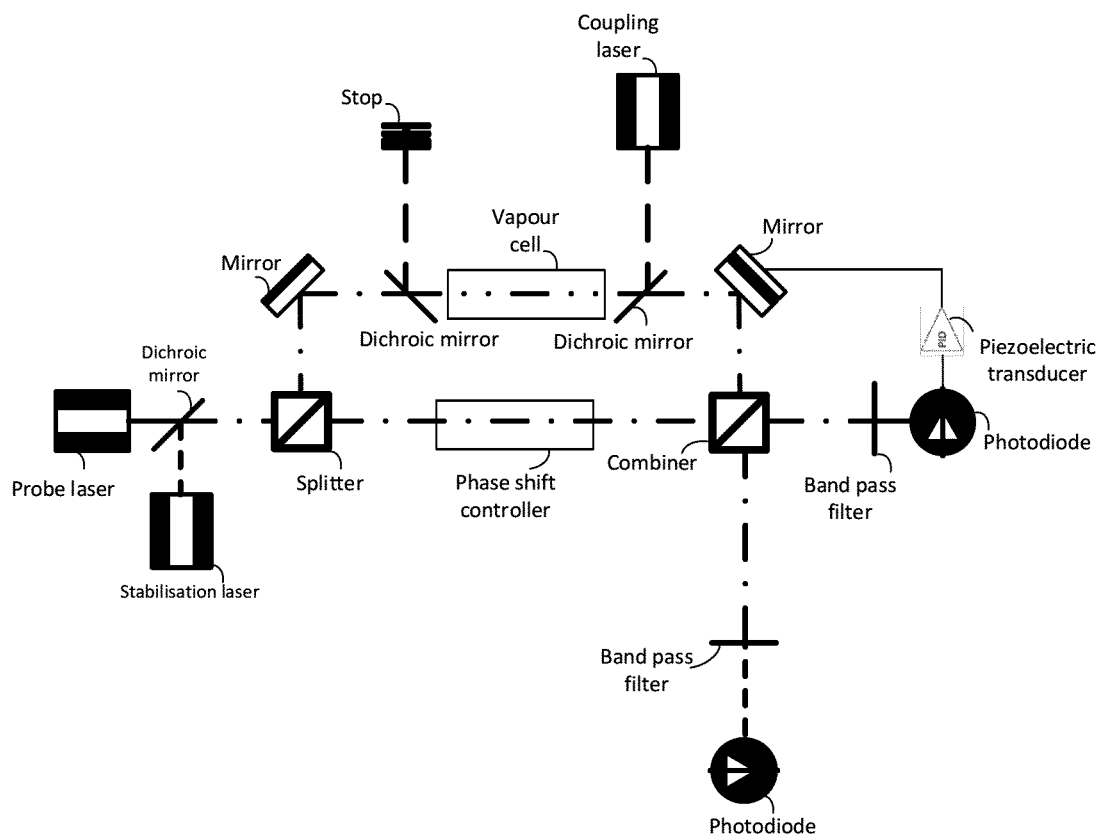
FIG. 8 is a schematic diagram of a Rydberg-atom based RF detector of a fourth embodiment of the present disclosure.
Figure 9:
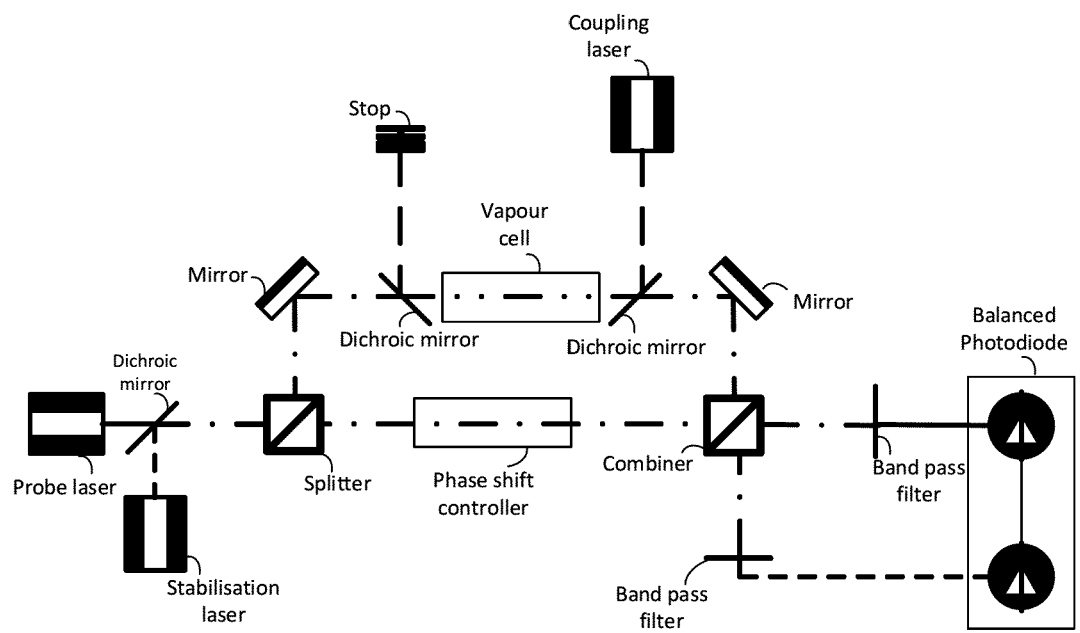
FIG. 9 is a schematic diagram of a Rydberg-atom based RF detector of a fifth embodiment of the present disclosure.
Figure 10:
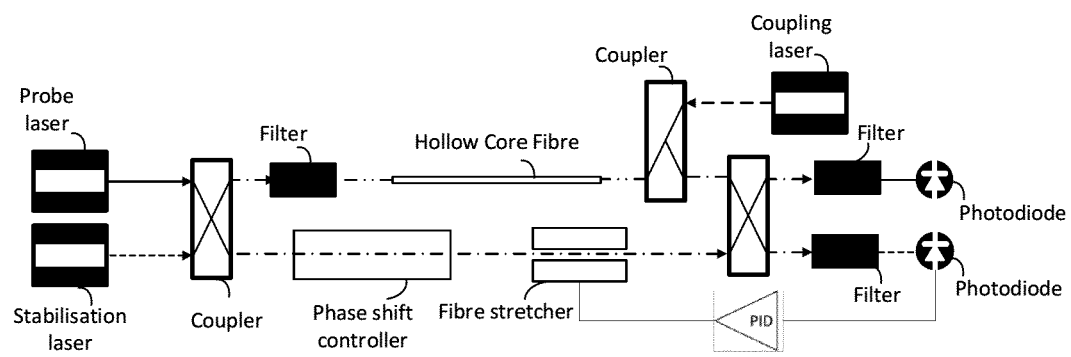
FIG. 10 is a schematic diagram of a Rydberg-atom based RF detector of a sixth embodiment of the present disclosure.
Figure 11:
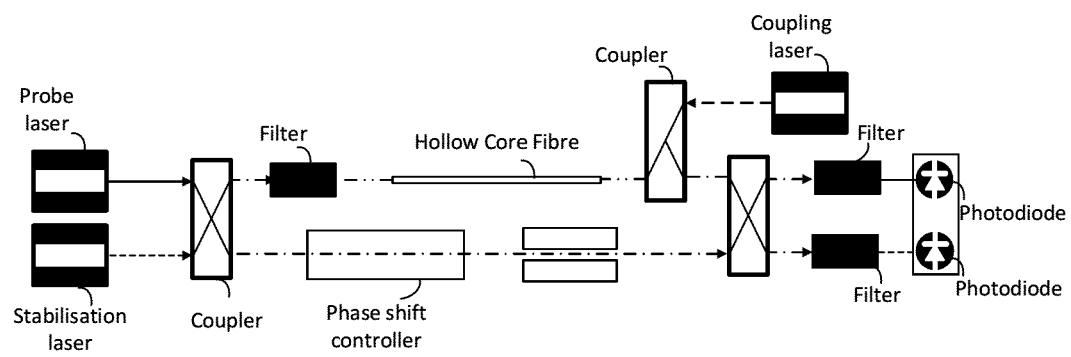
FIG. 11 is a schematic diagram of a Rydberg-atom based RF detector of a seventh embodiment of the present disclosure.

FIGS. 6 to 13 illustrate further embodiments of RF detectors of the present disclosure based on alternative interferometer designs. In each of FIGS. 6 to 13, a solid line represents the probe laser 23 only (i.e. not overlapping with any other laser, such as the coupling laser 25), a dashed line represents the coupling laser 25 only (i.e. not overlapping with any other laser, such as the probe laser 23) and a long dash short dash line represents an overlap of the probe and coupling lasers 23, 25. FIGS. 6 and 7 illustrate Mach-Zehnder interferometers, in which one path of a split probe laser passes through a vapor cell of Rubidium-85 atoms. FIG. 8 introduces a stabilization laser (in which a short dashed line represents the stabilization laser only (i.e. not overlapping with the probe and/or coupling lasers), a dashed single dotted line represents an overlap of the probe laser 23 and stabilization laser, and a dashed double dotted line represents an overlap of the probe laser 23, stabilization laser and coupling laser 25) and piezoelectric transducer to the Mach-Zehnder interferometer. The purpose of the stabilization laser and piezoelectric transducer is to keep the probe laser stable and resistant to the effects of vibration, changing temperature and/or changing pressure (by changing the position of one of the mirrors of one path of the probe laser based on a feedback loop generated by the photodiode that measures the intensity of the stabilization laser). The arrangement shown in FIG. 9 is similar to that of FIG. 8 but uses a balanced photodiode, instead of a piezoelectric transducer, as part of the stabilization technique. The arrangements shown in FIGS. 10 and 11 are similar to those in FIGS. 8 and 9 but use a Rubidium-85 filled hollow core fiber for transmission of the probe and coupling signals. FIG. 10 includes a fiber stretcher as part of the stabilization technique, in which the fiber stretcher varies the length of the fiber to compensate for changes in length due to pressure, temperature and/or vibration, whereas FIG. 11 uses two photodiodes to cancel out noise (in which the noise for the probe laser is slightly different to the noise for the stabilization laser).

Each of the arrangements of FIGS. 6 to 11 include a phase shift controller, which may be operated in the same manner as described above with reference to FIG. 4 so as to optimize the modulation depth at the photodetector.

Figure 12:
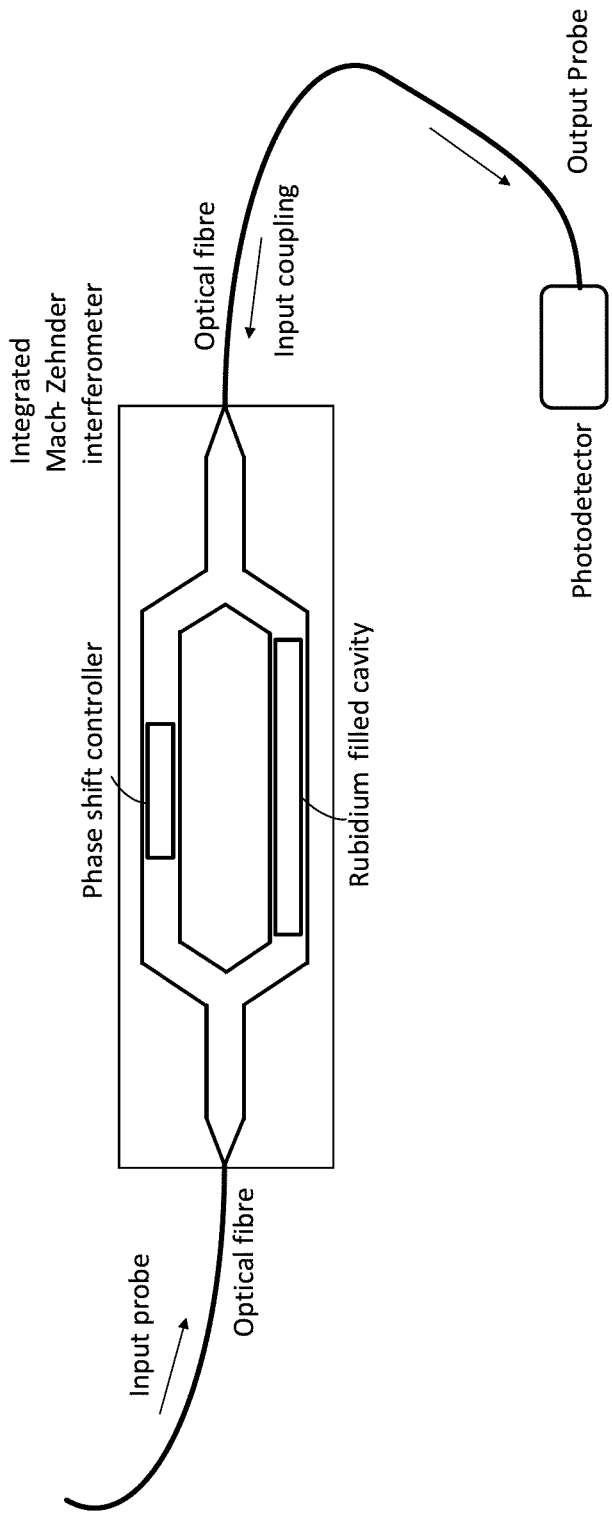
FIG. 12 is a schematic diagram of a Rydberg-atom based RF detector of an eighth embodiment of the present disclosure.

FIG. 12 is a further embodiment of the present disclosure in which the interferometer design is based on a Mach Zehnder Interferometer as a single integrated optical waveguide. The integrated optical waveguide may be constructed from a material such as Indium Phosphide. Optical fibers carrying the probe laser and coupling laser are attached to either end of the integrated optical waveguide to allow the counter-propagating probe and coupling lasers to pass through the two arms of the interferometer. One arm of the interferometer includes the phase shift controller operated as described above, and the second arm of the interferometer includes a Rubidium-85 vapor filled cavity.

Figure 13:
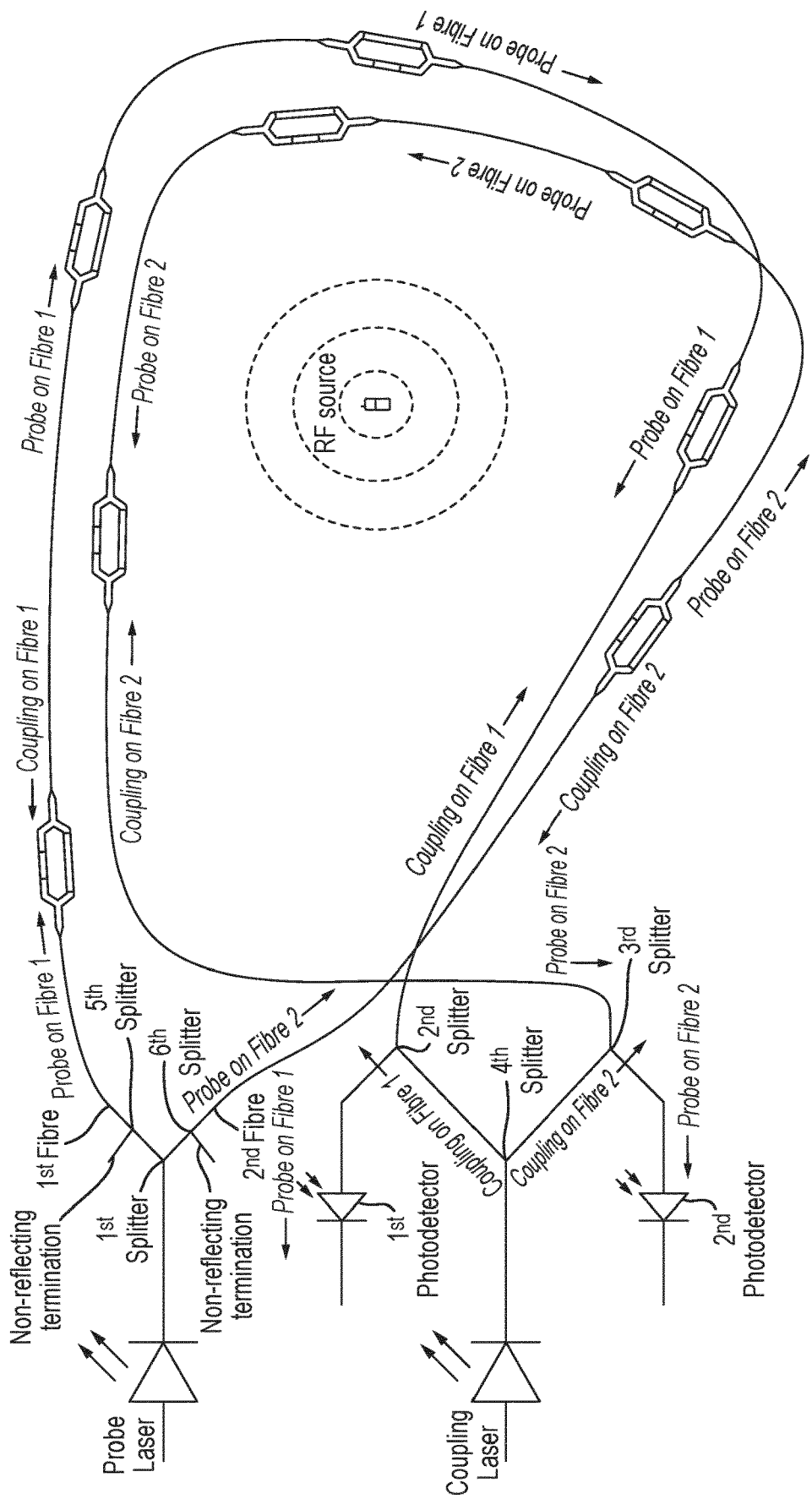
FIG. 13 is a schematic diagram of a Rydberg-atom based RF detector array of a ninth embodiment of the present disclosure.

FIG. 13 is a further embodiment of the present disclosure including an RF detector array in which each element of the array includes an RF detector. The RF detector array may be operated as described in UK patent application publication number 2588754 (herein incorporated by reference). In summary, the RF detector array includes a first optical fiber, a second optical fiber, a probe laser, and a coupling laser. The first optical fiber includes a first plurality of RF detectors (in this embodiment, each having the same arrangement as the RF detector of the embodiment shown in FIG. 12, such that each RF detector of the array includes a first path for the probe laser passing through a Rydberg-atom medium and a second path of the probe laser which does not pass through the Rydberg-atom medium) and the second optical fiber includes a second plurality of RF detectors (again, each having the same arrangement as the RF detector of the embodiment shown in FIG. 12, such that each RF detector of the array includes a first path for the probe laser passing through a Rydberg-atom medium and a second path of the probe laser which does not pass through the Rydberg-atom medium). The probe laser is configured to transmit a probe signal, which is split at a first optical splitter coupled to both the first and second optical fiber so that the probe signal passes through both the first and second optical fiber. The probe signal propagating on the first optical fiber is directed by a second optical splitter towards a first photodetector. The probe signal propagating on the second optical fiber is directed by a third optical splitter towards a second photodetector.

The coupling laser is configured to transmit a coupling signal, which is split at a fourth optical splitter coupled to both the first and second optical fiber so that the coupling signal passes through both the first and second optical fiber (in an opposing direction to the probe signal). The coupling signal is split by fifth and sixth optical splitters towards respective non-reflecting terminations.

The probe signal includes a plurality of distinct amplitude steps (in which a count of the distinct amplitude steps equals the number of RF detectors in the array). As the travel time of the probe signal from the probe laser to each photodetector is known to a very high accuracy, the received signal and transmitted signal can be compared to determine the modulation depth of each step of the probe signal corresponding with each RF detector of the array.

Figure 3:
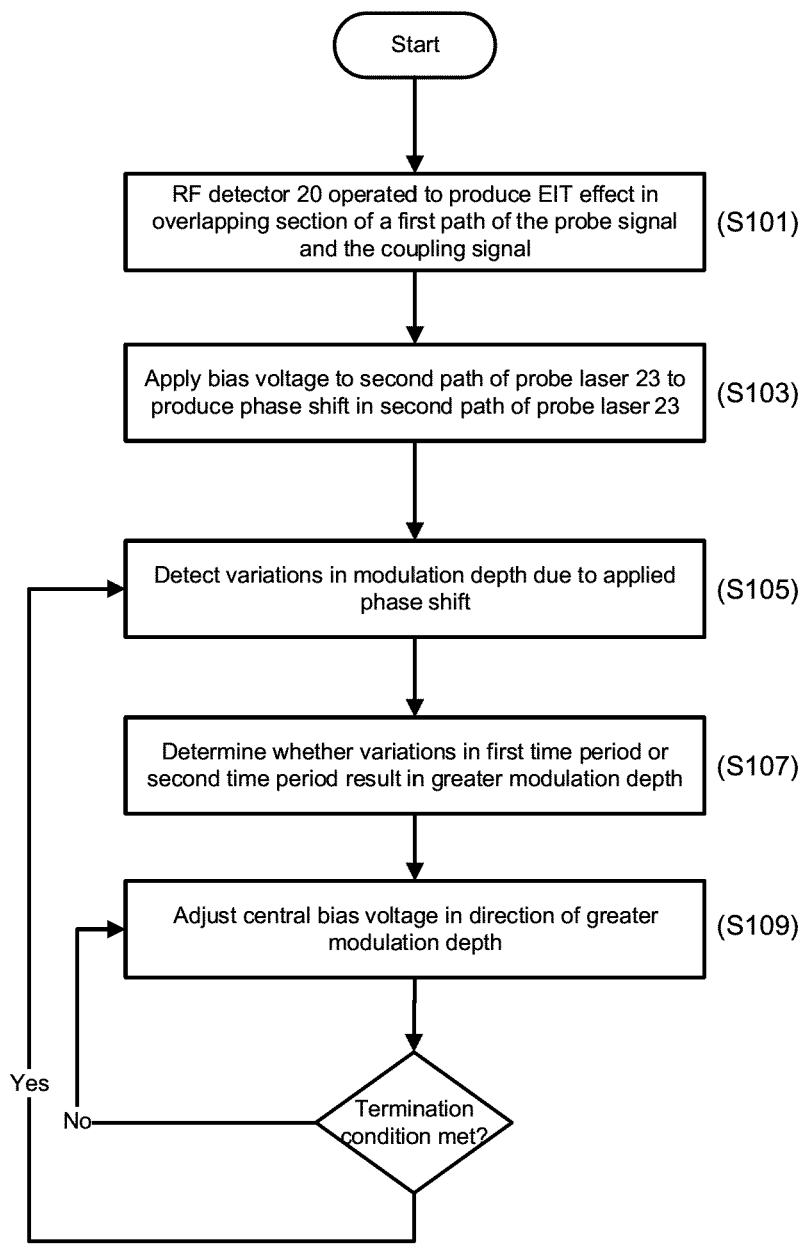
FIG. 3 is a flow diagram of a method of a first embodiment of the present disclosure.

Each RF detector in the array includes a phase shift controller configured to apply a phase shift to the second path of the probe laser of that RF detector (based on the same principle as described in the first embodiment above with reference to FIG. 3). Each RF detector of the first plurality of RF detectors may be communicatively coupled to the first photodetector in order to carry out the analysis of the combined first and second path of the probe signal of that RF detector and adjust the phase shift of the second path of the probe laser to optimize the modulation depth. Similarly, each RF detector of the second plurality of RF detectors may be communicatively coupled to the second photodetector in order to carry out the analysis of the combined first and second path of the probe signal of that RF detector and adjust the phase shift of the second path of the probe laser to optimize the modulation depth.

Alternatively, the RF detector array may include a central phase shift controller, communicatively coupled to each RF detector so as to communicate the bias voltage (having individual central bias voltages, modulation frequencies, upper bias limits and lower bias limits) to each phase shift controller. The central phase shift controller and the phase shift controllers of each RF detector of the array may communicate using time division or frequency division multiplexing to enable the phase shift controller of each RF detector of the array to apply its individual bias voltage.

In the embodiment of FIG. 2, the probe and coupling lasers 23, 25 overlap twice in the vapor cell 27. By increasing the effective length of the overlapping sections of the probe and coupling lasers 23, 25, more Rubidium-85 atoms may experience the EIT effect which increases the change in intensity upon an RF signal passing through these overlapping sections (as there is a greater corresponding change in refractive index, phase and optical path length). However, this is non-essential and the probe and coupling lasers may overlap in any configuration so long as the interaction volume (that is, the length of the overlapping sections multiplied by the area of overlap) is large enough for the photodetector 29 to detect an RF signal (which can be calculated from the photodetector's sensitivity and the expected power of the RF signal).

The embodiment of FIG. 2 describes a detector, in which a change in intensity of the combined first and second paths of the probe signal from a stable reference value indicates the presence of an RF signal at the vapor cell 27. The RF detector 20 may also be used as a receiver so as to receive (that is, demodulate) information contained with the wireless signals, such as by using an on-off keying communications protocol (in which the lack of an RF signal at the vapor cell 27 in a timeslot may indicate value zero whilst the presence of an RF signal at the vapor cell 27 in a timeslot may indicate value one). The skilled person will understand that other communications protocols and modulation schemes may be used. For example, the RF detector 20 may be used to receive frequency modulated data by determining a value for the RF dephasing based on the change in intensity at the photodetector 29 (which may be determined where the RF signal has a known received power) and thus tracking the change in frequency of a sequence of RF signals from the wireless transmitter 10.

The embodiment of FIG. 2 illustrates an example system for detecting wireless signals of 3.46 GHz. However, the skilled person will understand that the above method may be applied to many other electromagnetic signals of different frequencies, and the 3.46 GHz signal is just an example. That is, for a particular target frequency, a system may be configured such that an EIT signal is produced by an incident electromagnetic signal at that target frequency (such as by selecting an appropriate atomic medium (e.g. Rubidium, Cesium or Strontium) having Rydberg states that correspond with that target frequency). Once the relevant principal quantum number is known, the values of the other physical quantities (resonant frequencies, transition rates, dipole moments) may be determined. Furthermore, it is also non-essential that the EIT signal is produced following a ladder configuration of electron transitions. That is, any configuration (e.g. Lambda, Vee) may be used.

In the above embodiment, the probe and coupling lasers pass through a vapor cell of low-density Rubidium-85 atoms. As noted above, other alkali metals may be used. Furthermore, the skilled person will understand that one arm of the probe laser may be subject to the EIT effect using other arrangements, such as an optical fiber with hollow-core sections filled with an alkali metal vapor.

The skilled person will also understand that it is non-essential that the second path of the probe signal does not overlap with the coupling signal. That is, a change in intensity of the probe signal may still be detected at the optical receiver in response to an incident RF signal so long as there is a change in the optical path length difference between the first path of the probe signal and second path of the probe signal. Accordingly, the interferometric design of the Rydberg-atom based RF receiver may therefore exploit different changes in the optical path length of the first path of the probe signal relative to the optical path length of the second path of the probe signal upon receipt of the incident RF signal. This may be achieved, as in the embodiments above, by the first path of the probe signal passing through the vapor cell whilst the second path of the probe signal does not pass through the vapor cell, or, in alternative implementations, by both the first and second paths passing through the vapor cell but the interaction volume of the overlapping portion(s) of the coupling signal and first path of the probe signal being different to the interaction volume of the overlapping portion(s) of the coupling signal and the second path of the probe signal.

In the embodiment of FIG. 13, the phase shift controller of each RF detector may communicate with a central phase shift controller. This centralized arrangement may also be applied to the phase shift controllers of the other embodiments of the disclosure, such that a centralized phase shift controller determines the suitable bias voltage to apply at the phase shift controller and this is communicated to the phase shift controller.

In the process described with reference to FIG. 3, a cyclical bias voltage is applied to the second path of the probe laser such that the bias voltage varies between an upper bias limit and a lower bias limit either side of a central bias voltage. This has two benefits in that it enables the phase shift controller to detect the changes in modulation depth due to the bias voltage (as they occur at the modulation frequency) and it further enables the controller to determine the direction of change in the central bias voltage required to increase the modulation depth (by comparison of the change in modulation depth due to the bias voltage being between the central bias voltage and the upper bias limit to the change in modulation depth due to the bias voltage being between the central bias voltage and the lower bias limit). However, this is non-essential and the bias voltage may be non-cyclical instead (that is, such that there is no modulation of the bias voltage between upper and lower bias limits). In this non-cyclical version, the bias voltage is iteratively adjusted (such that the bias voltage is static during a single iteration) and, in each iteration, the modulation depth due to the previous bias voltage adjustment is analyzed to determine the direction of the next bias voltage adjustment. This iterative process is performed until the modulation depth change due to the previous bias voltage adjustment is less than a threshold. The process may then be repeated when the modulation depth decreases below a threshold level.

The skilled person will also understand that it is non-essential for the process of FIG. 3 to be implemented in the particular iterative manner. That is, other iterative processes and/or bias voltage variation patterns may be implemented instead. In another example, following one or more initial adjustments of the bias voltage, the phase shift controller may calculate a bias voltage to apply to the second path of the probe laser so as to arrive at the optimal (or at least increased) modulation depth.

Figure 14:
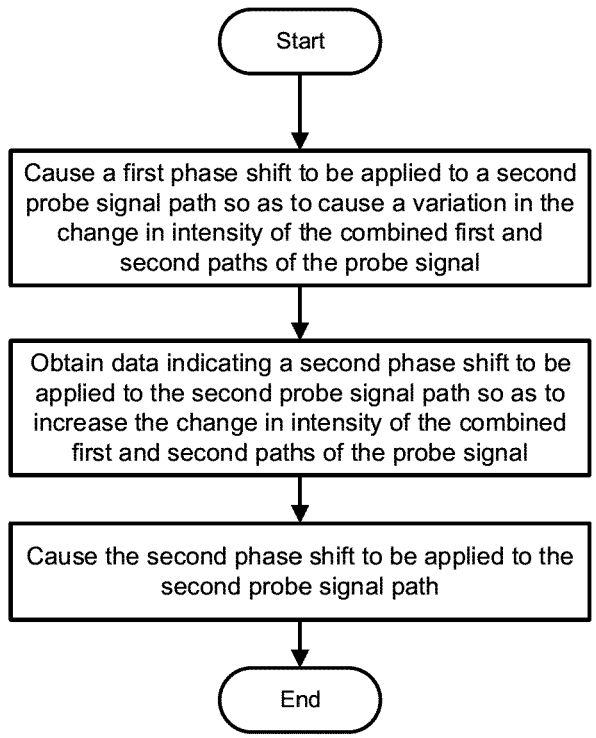
FIG. 14 is a flow diagram of a method of a further embodiment of the present disclosure.

The method of the present disclosure may therefore be implemented according to the embodiment illustrated in FIG. 14. In a first operation, a phase shift controller causes a first phase shift to be applied to the second probe signal path so as to cause a variation in the change in intensity of the combined first and second paths of the probe signal; in a second operation, the phase shift controller obtains data identifying a second phase shift to be applied to the second probe signal path so as to increase the change in intensity of the combined first and second paths of the probe signal, wherein the second phase shift is determinable from the variation in the change in intensity of the combined first and second paths of the probe signal caused by the first phase shift; and, in a third operation, the phase shift controller causes the second phase shift to be applied to the second probe signal path.

In all arrangements above, the probe and coupling lasers are transmitted in counter-propagating directions. This (at least partially) compensates for Doppler shift in the transmission medium of Rubidium atoms. However, this is non-essential and other techniques (such as cooling the sensor) may be used when the lasers propagate in the same direction.

In the embodiment described above, the RF detector 20 initially has an nΦ phase difference (in which n is an even number) between the first and second path of the probe laser 23. This enables, by applying a Φ phase shift to the second path of the probe laser 23, a maximum variation in intensity at the photodetector as a variation between fully constructive interference to fully destructive interference. However, this is non-essential, and the phase difference between the first and second paths of the probe laser 23 may have any value, and the process of the embodiment of the present disclosure will nonetheless operate to apply a particular phase shift that maximizes the variation in intensity for that phase difference.

The skilled person will understand that any combination of features is possible within the scope of the disclosure, as claimed.

The invention claimed is:

1. A method of controlling an electromagnetic field detector, wherein the electromagnetic field detector is configured to transmit a probe signal at a probe frequency in a first probe signal path and a second probe signal path to an optical receiver, wherein the first probe signal path passes through a transmission medium and the probe frequency is set to excite electrons of the transmission medium from a ground state to a first excited state; transmit a coupling signal at a coupling frequency in a first coupling signal path, wherein the first coupling signal path overlaps with the first probe signal path in the transmission medium in a first overlapping section, wherein the coupling frequency is set to excite electrons of the transmission medium to a predetermined excited state so as to induce an Electromagnetic Induced Transparency (EIT) effect in the transmission medium such that an incident electromagnetic field at the transmission medium causes a change in a refractive index in the transmission medium at the first overlapping section such that there is a change in an optical path length difference between the first probe signal path and the second probe signal path; combine the first probe signal path, following the first probe signal path passing the first overlapping section of the transmission medium, with the second probe signal path, such that the incident electromagnetic field at the first overlapping section is detectable, at the optical receiver, as a change in an intensity of the combined first probe signal path and the second probe signal path caused by the change in the optical path length difference between the first probe signal path and the second probe signal path, the method comprising:

causing a first phase shift to be applied to the second probe signal path so as to cause a variation in the change in intensity of the combined first probe signal path and the second probe signal path;

obtaining data indicating a second phase shift to be applied to the second probe signal path so as to increase the change in intensity of the combined first probe signal path and the second probe signal path, wherein the second phase shift is determinable from the variation in the change in intensity of the combined first probe signal path and the second probe signal path caused by the first phase shift; and causing the second phase shift to be applied to the second probe signal path.

2. The method as claimed in claim 1, wherein obtaining data indicating the second phase shift comprises monitoring the variation in the change in intensity of the combined first probe signal path and the second probe signal path in response to the application of the first phase shift.

3. The method as claimed in claim 2, wherein the first phase shift includes a first portion of the first phase shift in a first direction and a second portion of the first phase shift in a second direction, and monitoring the variation in the change in intensity comprises determining that the first portion of the first phase shift in the first direction causes an increase in the change in intensity of the combined first probe signal path and the second probe signal path, wherein the second phase shift is in the first direction.

4. The method as claimed in claim 1, wherein the second phase shift is one of a plurality of phase shifts applied to the second probe signal path iteratively until a termination condition is met.

5. The method as claimed in claim 4, wherein the termination condition is one of: when the increase in the change in intensity of the combined first probe signal path and the second probe signal path due to a phase shift of the plurality of phase shifts is less than a threshold, or when the change in intensity of the combined first probe signal path and the second probe signal path due to a phase shift of the plurality of phase shifts is a decrease in the intensity of the combined first probe signal path and the second probe signal path.

6. The method as claimed in claim 1, wherein the electromagnetic field detector includes a plurality of transmission media, the first probe signal path passes through each transmission medium of the plurality of transmission media, the coupling signal overlaps with the first probe signal path in each transmission medium of the plurality of transmission media so as to induce the EIT effect in each transmission medium of the plurality of transmission media such that an incident electromagnetic field at each transmission medium of the plurality of transmission media causes a change in the refractive index of that transmission medium such that there is a change in the optical path length difference between the first probe signal path and the second probe signal path, and the first probe signal path is combined, following the first probe signal path passing each transmission medium of the plurality of transmission media, with the second probe signal path such that the incident electromagnetic field at each transmission medium of the plurality of transmission media is detectable, at the optical receiver, as a change in the intensity of the combined first probe signal path and the second probe signal path caused by the change in the optical path length difference between the first probe signal path and the second probe signal path, the method further comprising:

causing a first phase shift to be applied to the second probe signal path of each transmission medium of the plurality of transmission media so as to cause a variation in the change in intensity of the combined first probe signal path and the second probe signal path;

obtaining data indicating a second phase shift to be applied to the second probe signal path of each transmission medium of the plurality of transmission media so as to increase the change in intensity of the combined first probe signal path and the second probe signal path, wherein the second phase shift is determinable from the variation in the change in intensity of the combined first probe signal path and the second probe signal path caused by the first phase shift; and causing the second phase shift to be applied to the second probe signal path of each transmission medium of the plurality of transmission media.

7. A device for controlling an electromagnetic field detector, wherein the electromagnetic field detector is configured to transmit a probe signal at a probe frequency in a first probe signal path and a second probe signal path to an optical receiver, wherein the first probe signal path passes through a transmission medium and the probe frequency is set to excite electrons of the transmission medium from a ground state to a first excited state, transmit a coupling signal at a coupling frequency in a first coupling signal path, wherein the first coupling signal path overlaps with the first probe signal path in the transmission medium in a first overlapping section, wherein the coupling frequency is set to excite electrons of the transmission medium to a predetermined excited state so as to induce an Electromagnetic Induced Transparency (EIT) effect in the transmission medium such that an incident electromagnetic field at the transmission medium causes a change in refractive index in the transmission medium at the first overlapping section such that there is a change in an optical path length difference between the first probe signal path and the second probe signal path, and combine the first path of the probe signal, following the first probe signal path passing through the first overlapping section of the transmission medium, and the second path of the probe signal such that the incident electromagnetic field at the first overlapping section is detectable, at the optical receiver, as a change in the intensity of the combined first probe signal path and the second probe signal path caused by the change in the optical path length difference between the first probe signal path and the second probe signal path, wherein the device comprises:

a phase shift controller adapted to:
    cause a first phase shift to be applied to the second probe signal path so as to cause a variation in the change in intensity of the combined first probe signal path and the second probe signal path;
    obtain data indicating a second phase shift to be applied to the second probe signal path so as to increase the change in intensity of the combined first probe signal path and the second probe signal path, wherein the second phase shift is determinable from the variation in the change in intensity of the combined first probe signal path and the second probe signal path caused by the first phase shift; and
    cause the second phase shift to be applied to the second probe signal path.

8. The device as claimed in claim 7, wherein the phase shift controller is adapted to monitor the variation in the change in intensity of the combined first probe signal path and the second probe signal path in response to the application of the first phase shift.

9. The device as claimed in claim 8, wherein the first phase shift includes a first phase shift portion in a first direction and a second phase shift portion in a second direction, and the phase shift controller is adapted to determine that the first phase shift portion in the first direction causes an increase in the change in intensity of the combined first probe signal path and the second probe signal path, wherein the second phase shift is in the first direction.

10. The device as claimed in claim 7, wherein the second phase shift is one of a plurality of phase shifts applied to the second probe signal path iteratively until a termination condition is met.

11. The device as claimed in claim 10, wherein the termination condition is one of: when the increase in the change in intensity of the combined first probe signal path and the second probe signal path due to a phase shift of the plurality of phase shifts is less than a threshold, or when the change in intensity of the combined first probe signal path and the second probe signal path due to a phase shift of the plurality of phase shifts is a decrease in the intensity of the combined first probe signal path and the second probe signal path.

12. The device as claimed in claim 7, wherein the electromagnetic field detector includes a plurality of transmission media, the first probe signal path passes through each transmission medium of the plurality of transmission media, the coupling signal overlaps with the first probe signal path in each transmission medium of the plurality of transmission media so as to induce the EIT effect in each transmission medium of the plurality of transmission media such that an incident electromagnetic field at each transmission medium of the plurality of transmission media causes a change in the refractive index of that transmission medium such that there is a change in the optical path length difference between the first probe signal path and the second probe signal path, and the first probe signal path is combined, following the first probe signal path passing each transmission medium of the plurality of transmission media, with the second probe signal path such that the incident electromagnetic field at each transmission medium of the plurality of transmission media is detectable, at the optical receiver, as a change in the intensity of the combined first probe signal path and the second probe signal path caused by the change in the optical path length difference between the first probe signal path and the second probe signal path, wherein the phase shift controller is further configured to:
    cause a first phase shift to be applied to the second probe signal path of each transmission medium of the plurality of transmission media so as to cause a variation in the change in intensity of the combined first probe signal path and the second probe signal path;
    obtain data identifying a second phase shift to be applied to the second probe signal path of each transmission medium of the plurality of transmission media so as to increase the change in intensity of the combined first probe signal path and the second probe signal path, wherein the second phase shift is determinable from the variation in the change in intensity of the combined first probe signal path and the second probe signal path caused by the first phase shift; and
    cause the second phase shift to be applied to the second probe signal path of each transmission medium of the plurality of transmission media.

13. A non-transitory computer-readable storage medium storing a computer program comprising instructions to cause an electromagnetic field detector to execute the method of claim 1.

14. A computer system comprising at least one processor and memory configured to carry out the method of claim 1.

* * * * *